United States Patent
Tamura

(10) Patent No.: US 10,388,380 B2
(45) Date of Patent: Aug. 20, 2019

(54) SEMICONDUCTOR DEVICE AND MEMORY CIRCUIT HAVING AN OS TRANSISTOR AND A CAPACITOR

(71) Applicant: Semiconductor Energy Laboratory Co., Ltd., Atsugi-shi, Kanagawa-ken (JP)

(72) Inventor: Hikaru Tamura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 33 days.

(21) Appl. No.: 15/823,662

(22) Filed: Nov. 28, 2017

(65) Prior Publication Data

US 2018/0082747 A1 Mar. 22, 2018

Related U.S. Application Data

(63) Continuation of application No. 14/712,207, filed on May 14, 2015, now Pat. No. 9,837,157.

(30) Foreign Application Priority Data

May 22, 2014 (JP) ................................ 2014-105748

(51) Int. Cl.
*G11C 16/10* (2006.01)
*G11C 7/16* (2006.01)
(Continued)

(52) U.S. Cl.
CPC ............ *G11C 16/10* (2013.01); *G11C 7/1078* (2013.01); *G11C 7/16* (2013.01); *G11C 11/40* (2013.01)

(58) Field of Classification Search
CPC ....... G11C 16/10; G11C 7/1078; G11C 11/40; G11C 7/16
(Continued)

(56) References Cited

U.S. PATENT DOCUMENTS 5,041,974 A   8/1991  Walker et al.
5,185,722 A * 2/1993  Ota .................. G11C 29/24
                                          365/189.04
(Continued)

FOREIGN PATENT DOCUMENTS

EP   1737044 A   12/2006
EP   2211466 A    7/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Sung Il Cho
(74) *Attorney, Agent, or Firm* — Fish & Richardson P.C.

(57) ABSTRACT

Provided is a semiconductor device capable of reducing its area, operating at a high speed, or reducing its power consumption. A circuit 50 is used as a memory circuit with a function of performing an arithmetic operation. One of a circuit 80 and a circuit 90 has a region overlapping with at least part of the other of the circuit 80 and the circuit 90. Accordingly, the circuit 50 can perform the arithmetic operation that is essentially performed in the circuit 60; thus, a burden of the arithmetic operation on the circuit 60 can be reduced. Moreover, the number of times of data transmission and reception between the circuits 50 and 60 can be reduced. Furthermore, the circuit 50 functioning as a memory circuit can have a function of performing an arithmetic operation while the increase in the area of the circuit 50 is suppressed.

14 Claims, 19 Drawing Sheets

(51) Int. Cl.
*G11C 7/10* (2006.01)
*G11C 11/40* (2006.01)

(58) Field of Classification Search
USPC .................................................. 365/185.05
See application file for complete search history.

(56) References Cited

U.S. PATENT DOCUMENTS

| | | | |
|---|---|---|---|
| 5,590,073 A * | 12/1996 | Arakawa | G11C 7/1051 |
| | | | 365/185.08 |
| 5,731,856 A | 3/1998 | Kim et al. | |
| 5,744,864 A | 4/1998 | Cillessen et al. | |
| 6,035,230 A * | 3/2000 | Kang | A61B 5/0006 |
| | | | 600/509 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,839,260 B2 * | 1/2005 | Ishii | B82Y 10/00 |
| | | | 257/E21.661 |
| 6,985,078 B2 | 1/2006 | Suzuki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,336,519 B2 * | 2/2008 | Ishii | B82Y 10/00 |
| | | | 365/156 |
| 7,385,224 B2 | 6/2008 | Ishii et al. | |
| 7,402,506 B2 | 7/2008 | Levy et al. | |
| 7,405,958 B2 * | 7/2008 | Okazawa | G11C 11/16 |
| | | | 365/130 |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,696,063 B2 | 4/2010 | Tsuchiya | |
| 7,732,819 B2 | 6/2010 | Akimoto et al. | |
| 7,982,250 B2 | 7/2011 | Yamazaki et al. | |
| 8,135,457 B2 | 3/2012 | Kodama | |
| 8,144,938 B2 * | 3/2012 | Amano | A61B 5/0059 |
| | | | 382/115 |
| 8,247,276 B2 | 8/2012 | Kondo et al. | |
| 8,472,227 B2 | 6/2013 | Liaw | |
| 8,508,967 B2 * | 8/2013 | Yamazaki | G11C 5/025 |
| | | | 365/149 |
| 8,513,977 B2 | 8/2013 | Matsuzaki | |
| 8,724,407 B2 | 5/2014 | Kobayashi et al. | |
| 8,898,023 B2 | 11/2014 | Kubo | |
| 8,920,321 B2 | 12/2014 | Yoda | |
| 8,958,252 B2 | 2/2015 | Kobayashi et al. | |
| 9,001,563 B2 | 4/2015 | Atsumi et al. | |
| 9,007,093 B2 | 4/2015 | Kurokawa et al. | |
| 9,007,812 B2 | 4/2015 | Koyama et al. | |
| 9,087,283 B2 | 7/2015 | Matsuzaki | |
| 9,287,294 B2 | 3/2016 | Yamazaki | |
| 9,299,393 B2 | 3/2016 | Koyama et al. | |
| 9,356,601 B2 | 5/2016 | Kurokawa et al. | |
| 9,443,563 B2 | 9/2016 | Atsumi et al. | |
| 9,601,178 B2 | 3/2017 | Yamazaki et al. | |
| 9,680,476 B2 | 6/2017 | Kurokawa et al. | |
| 9,916,793 B2 * | 3/2018 | Kozuma | G09G 3/34 |
| 9,990,965 B2 | 6/2018 | Atsumi | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0043668 A1 * | 3/2003 | Wickman | G11C 7/065 |
| | | | 365/207 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0121767 A1 * | 6/2004 | Simpson | G16H 40/20 |
| | | | 455/426.1 |
| 2004/0127038 A1 | 7/2004 | Carcia et al. | |
| 2005/0017302 A1 | 1/2005 | Hoffman | |
| 2005/0085864 A1 * | 4/2005 | Schulman | A61B 5/0028 |
| | | | 607/27 |
| 2005/0199959 A1 | 9/2005 | Chiang et al. | |
| 2005/0201141 A1 * | 9/2005 | Turner | G11C 5/005 |
| | | | 365/149 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0120133 A1 * | 6/2006 | Star Sung | G11C 11/5692 |
| | | | 365/94 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 * | 9/2006 | Kimura | G09G 3/2014 |
| | | | 345/76 |
| 2006/0228974 A1 | 10/2006 | Thelss et al. | |
| 2006/0231882 A1 | 10/2006 | Kim et al. | |
| 2006/0238135 A1 * | 10/2006 | Kimura | G09G 3/20 |
| | | | 315/169.3 |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 * | 3/2007 | Saito | H01L 27/1248 |
| | | | 313/506 |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0165441 A1 * | 7/2007 | Kurjanowicz | G11C 17/16 |
| | | | 365/96 |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 * | 10/2008 | Park | H01L 29/78618 |
| | | | 257/43 |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |

(56) References Cited

U.S. PATENT DOCUMENTS

| | | | |
|---|---|---|---|
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0298687 A1* | 11/2010 | Yoo | A61B 5/0006 600/391 |
| 2010/0300862 A1* | 12/2010 | Tamura | G06F 3/0412 200/600 |
| 2011/0101332 A1* | 5/2011 | Yamazaki | G11C 11/404 257/43 |
| 2011/0101351 A1 | 5/2011 | Yamazaki | |
| 2011/0175646 A1* | 7/2011 | Takemura | H03K 19/17784 326/44 |
| 2011/0182098 A1 | 7/2011 | Liaw | |
| 2012/0026818 A1* | 2/2012 | Chen | G11C 11/4097 365/207 |
| 2012/0039126 A1* | 2/2012 | Saito | G11C 11/405 365/185.08 |
| 2012/0057396 A1* | 3/2012 | Yamazaki | G11C 5/025 365/149 |
| 2012/0063208 A1* | 3/2012 | Koyama | G11C 5/025 365/149 |
| 2012/0063209 A1 | 3/2012 | Koyama et al. | |
| 2012/0069634 A1* | 3/2012 | Saito | G11C 11/404 365/149 |
| 2012/0146027 A1* | 6/2012 | Tamura | H01L 27/14692 257/53 |
| 2012/0161132 A1 | 6/2012 | Yamazaki | |
| 2012/0188814 A1* | 7/2012 | Yamazaki | G11C 11/404 365/149 |
| 2012/0275214 A1 | 11/2012 | Atsumi et al. | |
| 2012/0294069 A1* | 11/2012 | Ohmaru | H01L 27/1052 365/149 |
| 2013/0148411 A1 | 6/2013 | Atsumi et al. | |
| 2015/0005656 A1* | 1/2015 | Lee | A61B 5/0245 600/523 |
| 2015/0036410 A1* | 2/2015 | Ogiwara | G11C 7/065 365/72 |
| 2016/0203849 A1 | 7/2016 | Koyama et al. | |
| 2017/0256301 A1 | 9/2017 | Yamazaki et al. | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-150647 A | 5/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-308301 A | 11/2006 |
| JP | 2009-094494 A | 4/2009 |
| JP | 2009-158939 A | 7/2009 |
| JP | 2010-193432 A | 9/2010 |
| JP | 2011-155264 A | 8/2011 |
| JP | 2012-151453 A | 8/2012 |
| JP | 2012-256405 A | 12/2012 |
| JP | 2012-256408 A | 12/2012 |
| JP | 2012-256822 A | 12/2012 |
| JP | 2012-256837 A | 12/2012 |
| JP | 2013-145875 A | 7/2013 |
| JP | 2014-007737 A | 1/2014 |
| WO | WO-2004/114391 | 12/2004 |
| WO | WO-2012/128189 | 9/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al.,"Optical Studies of the Amorphous Liquid-Cholesteric Liquid Crystal Transition:The "Blue-Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or AL; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al.,"15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

(56) References Cited

OTHER PUBLICATIONS

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

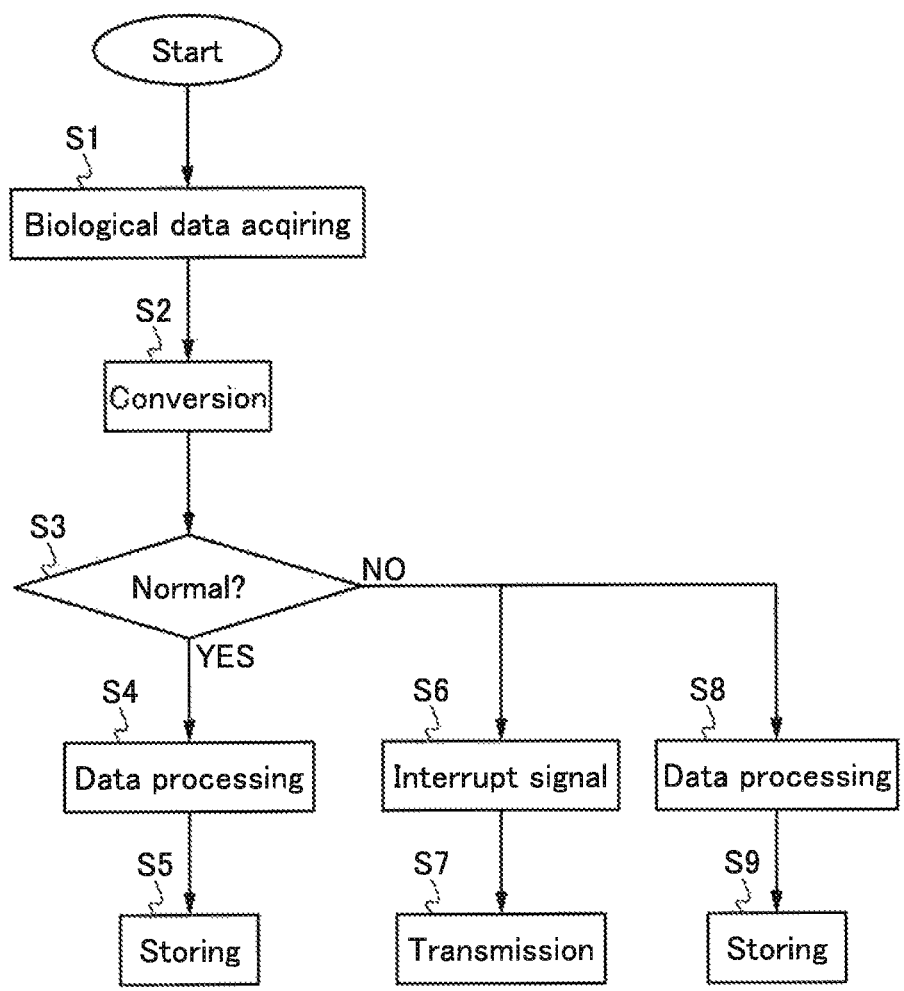

90

FIG. 17A
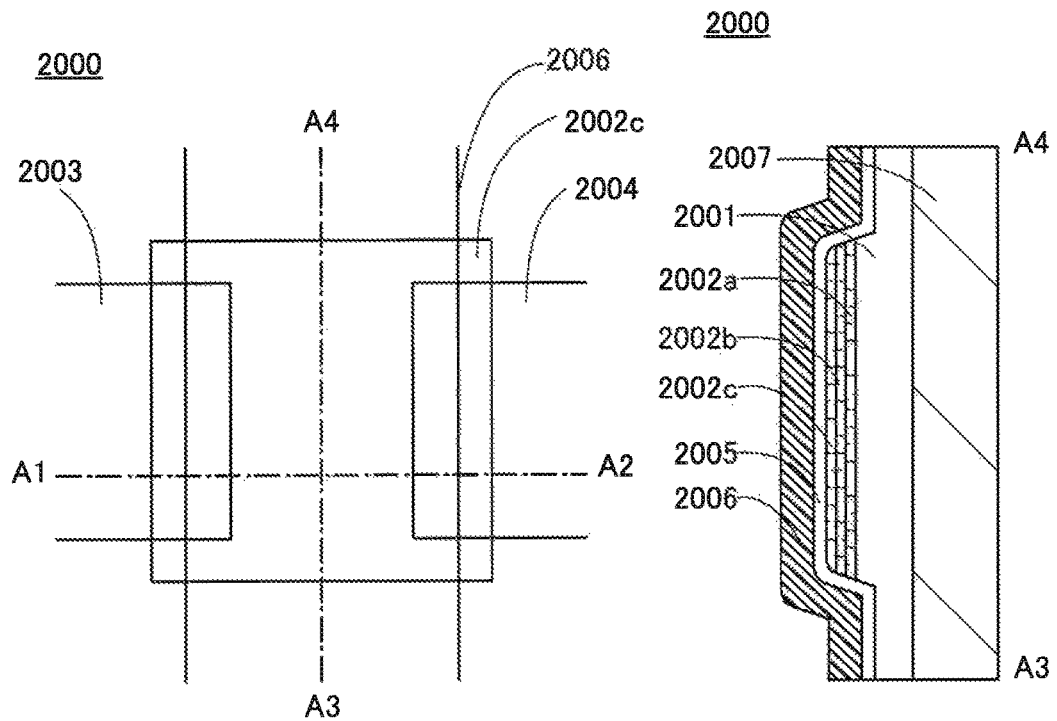
FIG. 17C
FIG. 17B
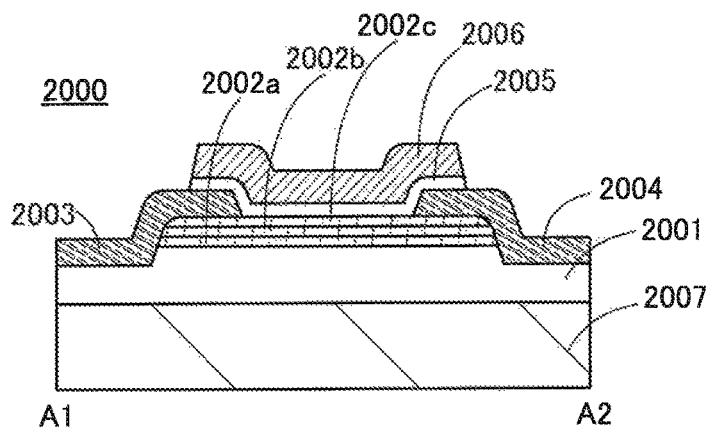

SEMICONDUCTOR DEVICE AND MEMORY CIRCUIT HAVING AN OS TRANSISTOR AND A CAPACITOR

CROSS-REFERENCE TO RELATED APPLICATIONS

This application is a continuation of U.S. application Ser. No. 14/712,207, filed May 14, 2015, now allowed, which claims the benefit of a foreign priority application filed in Japan as Serial No. 2014-105748 on May 22, 2014, both of which are incorporated by reference.

BACKGROUND OF THE INVENTION

1. Field of the Invention

One embodiment of the present invention relates to a semiconductor device having functions of storing data and performing an arithmetic operation, and also relates to a healthcare system using the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Another embodiment of the present invention relates to a semiconductor device, a display device, a lighting device, a power storage device, a memory device, or a driving method or manufacturing method thereof.

2. Description of the Related Art

To monitor biological data of persons and animals, healthcare systems which determine body temperature, a pulse rate, and the like using a sensor have been widely used.

A semiconductor device is usually used for the healthcare system, and the semiconductor device includes a memory for storing biological data, a processor provided with a logic circuit for processing data stored in the memory, and the like.

Patent Document 1 discloses an integrated circuit including a memory array and a logic circuit connected to the memory array.

Patent Document

[Patent Document 1] Japanese Published Patent Application No. 2011-155264

SUMMARY OF THE INVENTION

An object of one embodiment of the present invention is to provide a novel semiconductor device. Another object of one embodiment of the present invention is to provide a semiconductor device with reduced area. Another object of one embodiment of the present invention is to provide a semiconductor device capable of operating at a high speed. Another object of one embodiment of the present invention is to provide a semiconductor device capable of reducing power consumption.

One embodiment of the present invention does not necessarily achieve all the objects listed above and only needs to achieve at least one of the objects. The description of the above objects does not disturb the existence of other objects. Other objects will be apparent from and can be derived from the description of the specification, the drawings, the claims, and the like.

A semiconductor device according to one embodiment of the present invention includes a first circuit, a second circuit, and a third circuit. The first circuit has a function of acquiring data from the outside. The second circuit has a function of converting the data acquired in the first circuit into a digital signal. The third circuit includes a fourth circuit including a memory circuit and a fifth circuit including an arithmetic circuit. The fourth circuit is provided over the fifth circuit. One of the fourth circuit and the fifth circuit has a region overlapping with at least a part of the other of the fourth circuit and the fifth circuit. The memory circuit includes a transistor including an oxide semiconductor in a channel formation region.

A semiconductor device according to one embodiment of the present invention includes a first circuit, a second circuit, and a third circuit. The first circuit has a function of acquiring data from the outside. The second circuit has a function of converting the data acquired in the first circuit into a digital signal. The third circuit comprises a fourth circuit including a first memory circuit and a second memory circuit and a fifth circuit including an arithmetic circuit. The fourth circuit is provided over the fifth circuit. One of the fourth circuit and the fifth circuit has a region overlapping with at least a part of the other of the fourth circuit and the fifth circuit. The first memory circuit includes a first transistor including an oxide semiconductor in a channel formation region. The second memory circuit includes a second transistor including an oxide semiconductor in a channel formation region. The first memory circuit has a function of storing biological data acquired in the first circuit. The second memory circuit has a function of storing a reference value that is compared with the biological data. The fifth circuit has a function of comparing the biological data and the reference value.

In the semiconductor device according to one embodiment of the present invention, the first memory circuit may include a first capacitor. One of a source and a drain of the first transistor may be connected to the first capacitor. The second memory circuit may include a second capacitor and an inverter. One of a source and a drain of the second transistor may be connected to the second capacitor and an input terminal of the inverter. An output terminal of the inverter may be connected to the fifth circuit.

The semiconductor device according to one embodiment of the present invention may further include a third transistor. One of a source and a drain of the third transistor may be electrically connected to the first memory circuit. The other of the source and the drain of the third transistor may be electrically connected to the fifth circuit. The third transistor may include an oxide semiconductor in a channel formation region.

A healthcare system according to one embodiment of the present invention includes any one of the above semiconductor devices and has a function of transmitting and receiving a wireless signal.

According to one embodiment of the present invention, a novel semiconductor device can be provided. Alternatively, according to one embodiment of the present invention, a semiconductor device with reduced area can be provided. Alternatively, according to one embodiment of the present invention, a semiconductor device capable of operating at a high speed can be provided. Further alternatively, a semiconductor device capable of reducing power consumption can be provided.

Note that the description of these effects does not disturb the existence of other effects. In one embodiment of the present invention, there is no need to achieve all the effects.

Other effects will be apparent from and can be derived from the description of the specification, the drawings, the claims, and the like.

BRIEF DESCRIPTION OF THE DRAWINGS

FIG. 4 is a flowchart showing an operation of a semiconductor device.

FIGS. 17A to 17C illustrate an example of a structure of a transistor.

DETAILED DESCRIPTION OF THE INVENTION

Figure 1A:
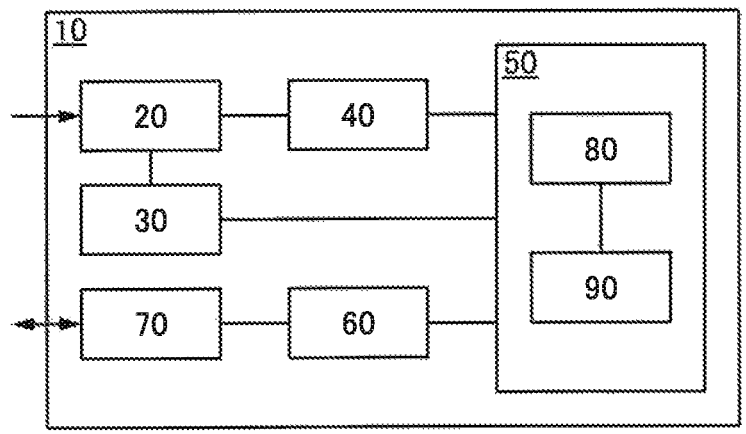
FIGS. 1A to 1C illustrate an example of a structure of a semiconductor device.

Hereinafter, embodiments of the present invention will be described below in detail with reference to the accompanying drawings. Note that the present invention is not limited to the following description and it is easily understood by those skilled in the art that the mode and details can be variously changed without departing from the scope and spirit of the present invention. Therefore, the present invention should not be construed as being limited to the description in the following embodiments.

One embodiment of the present invention includes, in its category, devices including an integrated circuit, such as a radio frequency (RF) tag and a display device. The display device includes, in its category, a display device including an integrated circuit, such as a liquid crystal display device, a light-emitting device in which a light-emitting element typified by an organic light-emitting element is provided in each pixel, an electronic paper, a digital micromirror device (DMD), a plasma display panel (PDP), and a field emission display (FED).

In describing structures of the present invention with reference to the drawings, common reference numerals are used for the same portions in different drawings.

Note that in this specification and the like, part of a diagram or a text described in one embodiment can be taken out to constitute one embodiment of the invention. Thus, in the case where a diagram or a text related to a certain portion is described, the context taken out from part of the diagram or the text is also disclosed as one embodiment of the invention, and one embodiment of the invention can be constituted. The embodiment of the present invention is clear. Therefore, for example, in a diagram or a text in which one or more active elements (e.g., transistors), wirings, passive elements (e.g., capacitors), conductive layers, insulating layers, semiconductor layers, components, devices, operating methods, manufacturing methods, or the like are described, part of the diagram or the text is taken out, whereby one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that, in this specification and the like, a content described in at least a diagram (which may be part of the diagram) is disclosed as one embodiment of the invention and can constitute one embodiment of the invention. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

When the range of a value that is defined by the maximum and minimum values is described, the range may be appropriately narrowed or part of the range may be excluded, whereby one embodiment of the invention excluding part of the range can be constructed. In this manner, it is possible to specify the technical scope of one embodiment of the present invention so that a conventional technology is excluded, for example.

Note that in this specification and the like, it might be possible for those skilled in the art to constitute one embodiment of the invention even when portions to which all the terminals of an active element (e.g., a transistor), a passive element (e.g., a capacitor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor), a passive element (e.g., a capacitor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

(Embodiment 1)

In this embodiment, a structure example of one embodiment of the present invention is described.

FIG. 1A illustrates a structure example of a semiconductor device 10 of one embodiment of the present invention. The semiconductor device 10 includes circuits 20, 30, 40, 50, 60, and 70.

In one embodiment of the present invention, the circuit 50 can be used as a memory circuit with a function of performing an arithmetic operation. The circuit 50 can output to the circuit 60 data stored in the circuit 50, data input from the circuit 40, and data obtained as a result of the arithmetic operation using these data as an input signal. The circuit 50 can perform the arithmetic operation that is essentially performed in the circuit 60; thus, a burden of the arithmetic operation on the circuit 60 can be reduced. Furthermore, the number of times of data transmission and reception between the circuits 50 and 60 can be reduced. Thus, the operation speed of the semiconductor device 10 can be improved. Each circuit in FIG. 1A is described below.

The circuit 20 has a function of acquiring data from the outside. The circuit 20 includes a sensor which has a function of acquiring predetermined physical quantities or predetermined chemical quantities, and the like.

Further, the physical quantities mentioned here indicate temperature, pressure, a flow rate, light, magnetism, a sound wave, acceleration, humidity, and the like. The chemical quantities mentioned here indicate quantities of chemical substances such as a gas component like a gas and a liquid component like an ion, and the like. In addition to the above, the chemical quantities further include quantities of organic compounds like a specific biological material contained in blood, sweat, urine, and the like. In particular, in order to acquire a chemical quantity, a specific substance is acquired selectively, and therefore, a substance which reacts with the specific substance to be acquired is provided in the circuit 20 in advance. For example, in the case of acquiring a biological material, it is preferable that an enzyme, a resistor molecule, a microbial cell, or the like which reacts with the biological material that is to be acquired be fixed in a polymer molecule or the like and provided in the circuit 20.

The circuit 20 preferably has a function of acquiring biological data of persons or animals. Examples of the biological data include body temperature, blood pressure, a pulse rate, the amount of sweat, lung capacity, a blood sugar level, the number of white blood cells, the number of red blood cells, the number of platelets, hemoglobin concentration, a hematocrit value, a GOT(AST) value, a GPT(ALT) value, a γ-GTP value, an LDL cholesterol value, an HDL cholesterol value, a neutral fat value, and the like. The circuit 20 has a function of acquiring biological data; thus, the semiconductor device 10 can be used as a healthcare system.

The circuit 30 has a function of controlling acquisition of data in the circuit 20. The circuit 30 can be formed using a timer which has a function of controlling the frequency and timing at which the circuit 20 acquires data from the outside, and the like. Further, the circuit 30 can measure time at which the circuit 20 has acquired data from the outside, and can output the time to the circuit 50.

The circuit 40 has a function of converting data acquired in the circuit 20 into a digital signal. The circuit 40 can be formed using an AD converter which has a function of converting an analog signal corresponding to biological data input from the circuit 20 into a digital signal.

The circuit 50 has a function of storing data input from the circuit 40. Further, the circuit 50 has a function of performing an arithmetic operation using the data input from the circuit 40 or data stored in the circuit 50 as an input signal. That is, the circuit 50 can be used as a memory circuit with a function of performing an arithmetic operation.

Specifically, the circuit 50 includes a circuit 80 and a circuit 90. The circuit 80 includes a circuit which has a function of storing data (hereinafter also referred to as a memory circuit). The circuit 80 can be formed using a cell array including a plurality of memory circuits. The memory circuit can be formed using a volatile memory cell such as a DRAM cell or an SRAM cell, or a nonvolatile memory cell such as an EPROM cell or an MRAM cell. In particular, the memory circuit is preferably formed using a transistor including an oxide semiconductor in its channel formation region (hereinafter also referred to as an OS transistor).

An oxide semiconductor has a wider band gap and lower intrinsic carrier density than silicon and the like. Thus, the off-state current of the OS transistor is extremely low. As a result, the use of the OS transistor for the memory circuit included in the circuit 80 enables the data stored in the memory circuit to be held for a long time.

The OS transistor can operate at a high speed when miniaturized. Thus, the operation speed of the memory circuit included in the circuit 80 can be increased with the use of the OS transistor for the memory circuit included in the circuit 80.

The circuit 90 includes a circuit which has a function of performing an arithmetic operation (hereinafter also referred to as an arithmetic circuit). The arithmetic circuit can be formed using a logic circuit such as a NOT circuit, an AND circuit, an OR circuit, a NAND circuit, a NOR circuit, an XOR circuit, or an XNOR circuit. Further, a comparison circuit, an adder circuit, a subtractor circuit, a multiplier circuit, a divider circuit, or the like may be formed by combining any of these logic circuits.

The circuit 90 has a function of performing an arithmetic operation using data input from the circuit 40 or data stored in the circuit 80 as an input signal. For example, in the case where the circuit 90 includes a comparison circuit, the data input from the circuit 40 and the data stored in the circuit 80 can be compared with each other. In the case where the data input from the circuit 40 is biological data acquired in the circuit 20 and the data stored in the circuit 80 is a predetermined reference value, it can be determined whether the biological data is normal or abnormal by comparing the biological data and the reference value in the circuit 90. Note that a structure may be employed in which data input from the circuit 40 is once stored in the circuit 80 and an arithmetic operation using the data as an input signal is performed.

In the case where the circuit 90 includes a subtractor circuit, a difference between data input from the circuit 40 and data stored in the circuit 80 can be calculated. Further, in the case where the circuit 90 includes an adder circuit and a divider circuit, the average value of data input from the circuit 40 and data stored in the circuit 80 can be calculated. In the case where the data input from the circuit 40 is biological data acquired in the circuit 20 and the data stored in the circuit 80 is biological data acquired before, variation and the average value of the biological data can be calculated in the circuit 90.

Figure 1B:
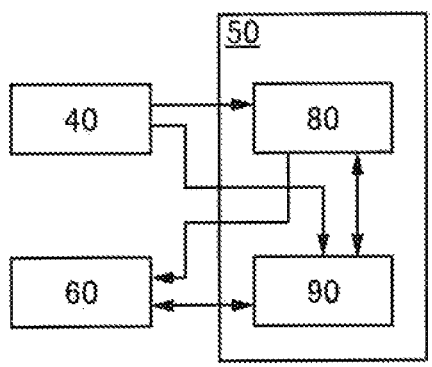

As shown in FIG. 1B, the circuit 80 has a function of storing data input from the circuit 40 or data obtained by an arithmetic operation in the circuit 90. The circuit 80 has a function of outputting the data stored in the circuit 80 to the circuit 90 or the circuit 60. The circuit 90 has a function of performing an arithmetic operation using the data input from the circuit 40 or the data stored in the circuit 80 as an input signal. Further, the circuit 90 has a function of outputting a result of the arithmetic operation to the circuit 80 or the circuit 60.

The circuit 60 has functions of performing data processing, controlling another circuit, and the like. The circuit 60 can be formed using a processor and the like including a variety of logic circuits such as a sequential circuit and a combination circuit which include a plurality of transistors. Note that in one embodiment of the present invention, the circuit 50 includes the circuit 90 including an arithmetic circuit. Thus, the arithmetic operation that is essentially performed in the circuit 60 (specifically, the arithmetic operation using the data stored in the circuit 80 as an input signal) can be performed in the circuit 50. Therefore, access to the data stored in the circuit 50 from the circuit 60 and writing of the result of the arithmetic operation by the circuit 60 to the circuit 50 can be omitted, resulting in a reduction in the number of times of data transmission and reception between the circuit 50 and the circuit 60.

The circuit 70 is a communication circuit having a function of transmitting and receiving a signal. The circuit 70 is controlled by the circuit 60, and is capable of transmitting the data stored in the circuit 80 or the result of the arithmetic operation by the circuit 90 to the outside of the semiconductor device 10. The data transmitted from the circuit 70 can be read out with a computer provided outside the semiconductor device or a reader/writer, or the like.

Note that the transmission and reception of a signal in the circuit 70 may be performed via wire or wirelessly. In the case where the transmission and reception of a signal in the circuit 70 are performed using a wireless signal, the semiconductor device 10 can be used as a wearable healthcare system that can be worn on clothing or a human body.

As described above, in one embodiment of the present invention, the circuit 50 can be used as a memory circuit with a function of performing an arithmetic operation. The circuit 50 can output to the circuit 60 data stored in the circuit 50, data input from the circuit 40, and data obtained as a result of the arithmetic operation using these data as an input signal. The circuit 50 can perform the arithmetic operation that is essentially performed in the circuit 60; thus, a burden of the arithmetic operation on the circuit 60 can be reduced. Furthermore, the number of times of data transmission and reception between the circuits 50 and 60 can be reduced. Thus, the operation speed of the semiconductor device 10 can be increased.

Figure 1C:
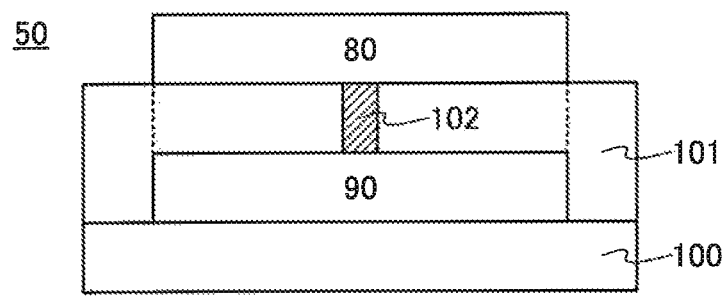

FIG. 1C is a schematic view of a cross sectional structure of the circuit 50. The circuit 50 includes the circuit 90 over a substrate 100, an insulating layer 101 over the circuit 90, and the circuit 80 over the insulating layer 101. That is, the circuit 50 has a structure in which the circuit 90 and the circuit 80 are stacked. The insulating layer 101 has an opening, and a conductive layer 102 is provided in the opening. The circuit 90 is connected to the circuit 80 through the conductive layer 102.

Here, one of the circuit 80 and the circuit 90 preferably has a region overlapping with at least part of the other of the circuit 80 and the circuit 90. In that case, the circuit 50 which functions as a memory circuit can have an additional function of performing an arithmetic operation while the increase in the area of the circuit 50 is suppressed. Thus, the area of the semiconductor device 10 can be reduced. When one of the circuit 80 and the circuit 90 has a region overlapping with an entire surface of the other of the circuit 80 and the circuit 90, the area of the circuit 50 can be further reduced.

Note that in this specification and the like, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts. Here, X and Y each denote an object (e.g., a device, an element, a circuit, a line, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. Note that, for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in the drawing, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

The circuit 90 can be formed using a transistor whose channel formation region is formed in part of the substrate 100. In this case, the substrate 100 preferably includes a single crystal semiconductor. A single crystal silicon substrate, a single crystal germanium substrate, or the like can be used as the substrate 100. By using a substrate including a single crystal semiconductor as the substrate 100, the circuit 90 can be formed using a transistor including a single crystal semiconductor in its channel formation region. The transistor including a single crystal semiconductor in its channel formation region has a higher current supply capability; thus formation of the circuit 90 using such a transistor improves the operation speed of the circuit 90.

Next, an example of the structure of the circuit 50 is described with reference to FIGS. 2A and 2B.

Figure 2A:
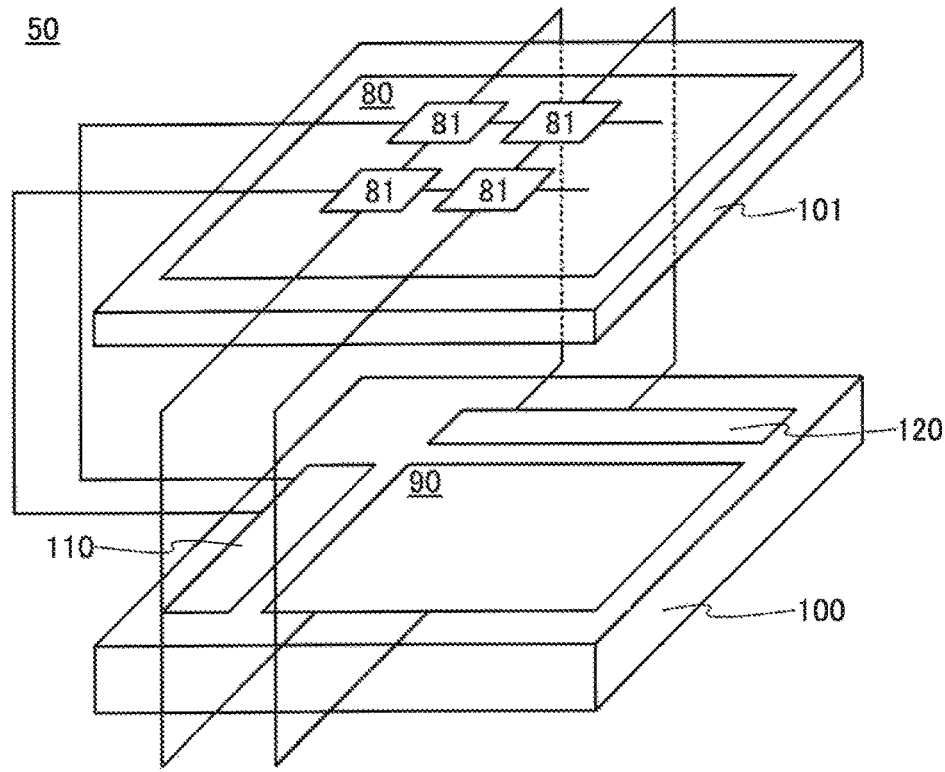
FIGS. 2A and 2B illustrate examples of a structure of a semiconductor device.

FIG. 2A is a perspective view illustrating an example of the circuit 50 in FIGS. 1A to 1C. The circuit 50 includes the circuit 90 and circuits 110 and 120 which are formed over the substrate 100, the insulating layer 101 formed over the circuits 90, 110, and 120, and the circuit 80 formed over the insulating layer 101. The circuit 80 includes a plurality of memory circuits 81.

The circuit 90 includes an arithmetic circuit, and is connected to the memory circuits 81. The circuit 90 can perform an arithmetic operation using data stored in the memory circuits 81 as an input signal and output a result of the arithmetic operation to the circuit 60 (see FIG. 1B). Note that the circuit 90 can also perform an arithmetic operation using data input from the outside of the circuit 50 (e.g., the circuit 40 in FIG. 1B) as an input signal.

The circuit 110 is a driver circuit which has a function of selecting a specific memory circuit 81 from the plurality of memory circuits 81. Specifically, the circuit 110 has a function of supplying a wiring connected to the specific memory circuit 81 with a signal (hereinafter also referred to as a selection signal) for selecting the specific memory circuit 81.

The circuit 120 is a driver circuit which has functions of writing data to the memory circuits 81 and reading data stored in the memory circuits 81. Specifically, the circuit 120 has a function of supplying a potential (hereinafter also referred to as a writing potential) corresponding to data to be written to the specific memory circuit 81 to the wiring connected to the specific memory circuit 81. Further, the circuit 120 has a function of reading data stored in the specific memory circuit 81 in accordance with a potential of the wiring connected to the specific memory circuit 81. Note that the circuit 120 may have a precharge function for supplying a predetermined potential to the wiring connected to the memory circuit 81.

Here, the substrate 100 is preferably a substrate including a single crystal semiconductor. Thus, the circuits 90, 110, and 120 can be formed using transistors each including a single crystal semiconductor in its channel formation region. Accordingly, the operation speed of the circuits 90, 110, and 120 can be improved.

The circuit 80 can be formed using a cell array including the plurality of memory circuits 81 as memory cells. Note that each of the plurality of memory circuits 81 is connected to the circuits 90, 110, and 120.

Here, each memory circuit 81 can be formed using a transistor whose channel formation region is formed in a semiconductor film. For example, the memory circuit 81 can be formed using a transistor including a non-single-crystal semiconductor in its channel formation region. As the non-single-crystal semiconductor, non-single-crystal silicon such as amorphous silicon, microcrystalline silicon, or polycrystalline silicon, non-single-crystal germanium such as amorphous germanium, microcrystalline germanium, or polycrystalline germanium, or the like can be used. Furthermore, the memory circuit 81 can be formed using an OS transistor. The transistor whose channel formation region is formed in the above-described semiconductor film can be formed over the insulating layer 101; thus, the memory circuit 81 can be formed over the insulating layer 101. Thus, the circuit 50 can have a structure in which the circuit 80 and the circuit 90 are stacked.

In particular, the memory circuit 81 is preferably formed using an OS transistor. The OS transistor has extremely low off-state current; thus, the use of the OS transistor for the memory circuit 81 allows data stored in the memory circuit 81 to be held for a long period even after the supply of power to the circuit 80 is stopped. Thus, the memory circuit 81 can be used as a nonvolatile memory cell or a memory cell with an extremely low refresh frequency.

Furthermore, the OS transistor can operate at a high speed when miniaturized. Thus, the operation speed of the memory circuit 81 can be improved by the use of the OS transistor for the memory circuit 81. Specifically, the writing speed and the reading speed of the memory circuit 81 can be less than or equal to 10 ns, preferably less than or equal to 5 ns, further preferably less than or equal to 1 nm. Note that the channel length of the OS transistor can be less than or equal to 100 nm, preferably less than or equal to 60 nm, further preferably less than or equal to 40 nm, further more preferably less than or equal to 30 nm.

Here, the circuit 90 preferably has a region overlapping with the circuit 80. Specifically, the circuit 90 preferably has a region overlapping with at least any of the plurality of memory circuits 81. Accordingly, the circuit 50 which functions as a memory circuit can have an additional function of performing an arithmetic operation while the increase in the area of the circuit 50 is suppressed. Note that the circuit 90 is positioned so as to have region overlapping with all of the plurality of memory circuits 81; thus, the area of the circuit 50 can be further reduced. Further, the circuit 110 or the circuit 120 can be positioned so as to have a region overlapping with at least any of the plurality of memory circuits 81.

Note that in FIG. 2A, one layer of the circuit 80 including the plurality of memory circuits 81 is provided; however, such a circuit with two or more layers may be provided. For example, a structure may be employed in which an insulating layer is provided over the circuit 80 and a circuit including the plurality of memory circuits 81 is provided thereover. With this structure, high capacity of the memory circuit can be achieved while the increase in the area of the circuit 50 is suppressed.

FIG. 2A illustrates an example in which the circuit 110 and the circuit 120 are provided over the substrate 100; however, the structure is not limited to this example. The circuit 110 and the circuit 120 may be provided over the insulating layer 101 (FIG. 2B). In this case, the circuit 110 and the circuit 120 can be formed using transistors whose channel formation regions are formed in a semiconductor film. In particular, the circuit 110 and the circuit 120 are preferably formed using OS transistors which have small off-state current and are capable of high-speed operation.

Figure 2B:
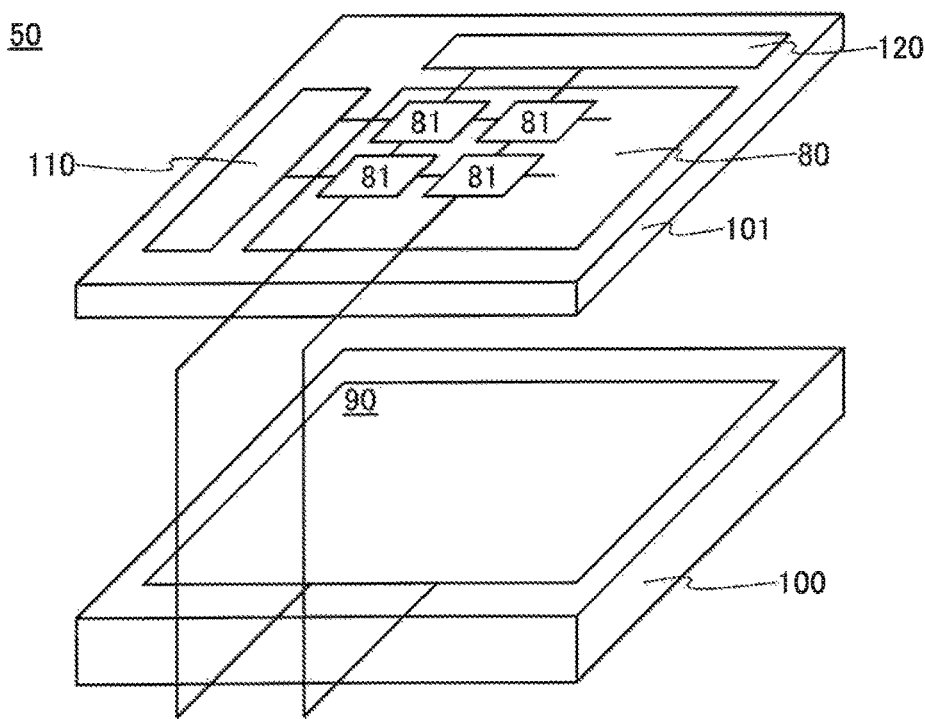
Figure 3A:
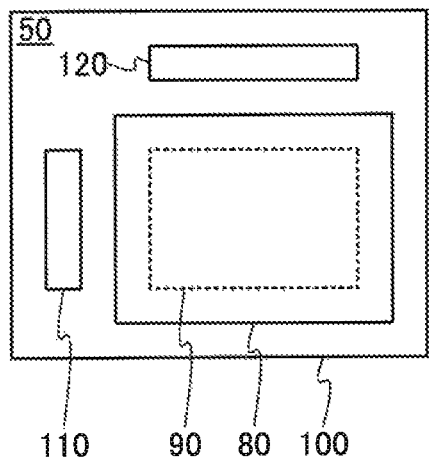
FIGS. 3A to 3D illustrate examples of a structure of a semiconductor device.
Figure 3B:
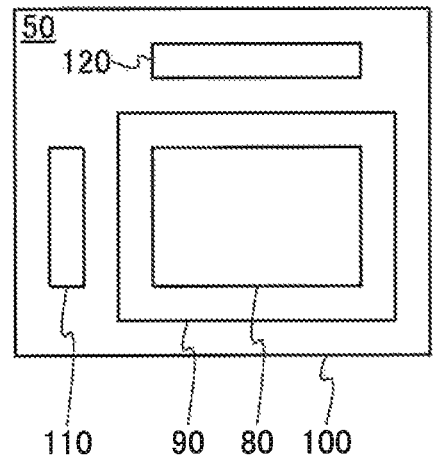
Figure 3C:
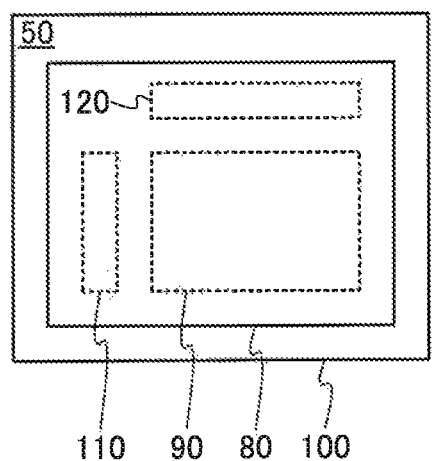
Figure 3D:
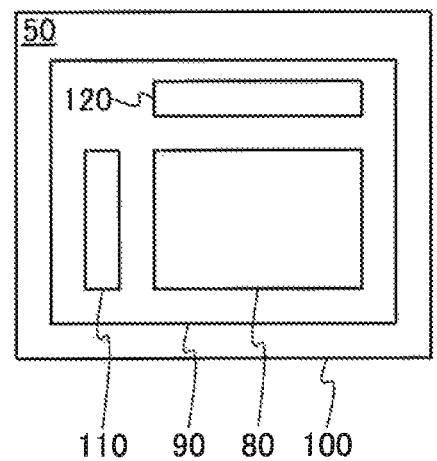

FIGS. 3A to 3D illustrate examples of a top view of the circuit 50. FIG. 3C corresponds to a top view of the structure (see FIG. 2A) in which the circuit 110 and the circuit 120 are provided over the substrate 100. FIG. 3D corresponds to a top view of the structure (see FIG. 2B) in which the circuit 110 and the circuit 120 are provided over the insulating layer 101.

As illustrated in FIG. 3A, the circuit 80 may be placed so as to have a region overlapping with an entire surface of the circuit 90. Accordingly, the increase in the area of the circuit 50 can be suppressed as compared to the case where the circuit 80 and the circuit 90 are formed on the same plane. Note that the circuit 80 may be positioned so as to have a region overlapping with part of the circuit 90.

As shown in FIG. 3B, the circuit 90 may be placed so as to have a region overlapping with an entire surface of the circuit 80. Note that the circuit 90 may be positioned so as to have a region overlapping with part of the circuit 80.

As shown in FIG. 3C, the circuit 80 may be placed so as to have regions overlapping with the entire surface of the circuit 90, the entire surface of the circuit 110, and the entire surface of the circuit 120. In this case, while the increase in the area of the circuit 50 is suppressed, the area of the circuit 80 can be larger than that in the structures illustrated in FIGS. 3A and 3B. With this structure, high capacity of the memory circuit 80 which function as a memory circuit can be achieved. Note that the circuit 80 may be placed so as to overlap with part of the circuit 110, or may be placed so as to overlap with part of the circuit 120.

As shown in FIG. 3D, the circuit 90 can also be placed so as to have regions overlapping with the entire surfaces of the circuit 80, the circuit 110, and the circuit 120. In this case, while the increase in the area of the circuit 50 is suppressed, the area of the circuit 90 can be larger than that in the structures illustrated in FIGS. 3A and 3B. Accordingly, the number and the kinds of arithmetic circuits included in the circuit 90 can be increased. Thus, the operation speed of the circuit 90 can be improved, and the kind of the arithmetic operations can be increased. Note that the circuit 90 may be placed so as to overlap with part of the circuit 110; alternatively, the circuit 90 may be placed so as to overlap with part of the circuit 120.

Next, an example of operation of the semiconductor device 10 in FIG. 1 is described with reference to a flowchart of FIG. 4. Here, description is given of the case where the semiconductor device 10 is used as a healthcare system which can determine whether the acquired biological data is normal or abnormal.

First, the circuit 20 is controlled by the circuit 30 so that biological data is acquired (Step S1). Then, an analog signal corresponding to the acquired biological data is converted into a digital signal in the circuit 40 (Step S2).

Next, in the circuit 50, whether the biological data is normal or abnormal is determined (Step S3). This determination is performed in the circuit 90 by comparison between a value of the biological data input from the circuit 40 to the circuit 50 and a reference value previously stored in the circuit 80. For example, in the case of measuring a blood sugar level (BS), a predetermined blood sugar level (e.g., BS=126 (mg/dl)) is stored in the circuit 80 as a reference value. Then, the value of a blood sugar level input from the circuit 40 is compared with the reference value. When the blood sugar level is less than the reference value, it is determined as normal. When the blood sugar level is greater than or equal to the reference value, it is determined as abnormal.

When the biological data is determined to be normal as a result of the determination in Step S3, data processing is performed in the circuit 90 (Step S4). Examples of the data processing in the circuit 90 include calculation of variation in the biological data and calculation of an average value of the biological data.

The variation in the biological data can be obtained by calculating a difference between a value of the biological data acquired by a certain time and a value of the biological data acquired before the certain time. The calculation of the difference can be performed by provision of a subtractor circuit as the arithmetic circuit in the circuit 90.

Further, the average value of the biological data can be obtained by calculating the sum of the values of the biological data acquired by the certain time and dividing the value by the number of the acquired biological data. Note that the average value can be calculated by provision of an adder circuit or a divider circuit as the arithmetic circuit in the circuit 90.

After that, the result obtained through the data processing is stored in the circuit 80 (Step S5). Note that the data stored in the circuit 80 can be transmitted from the circuit 70 to the outside by the control of the circuit 60.

Note that the data processing in Step S4 can be omitted in the case where the biological data input from the circuit 40 is directly stored in the circuit 80 or output to the circuit 60 without performing data processing in the circuit 90.

When the biological data is determined to be abnormal as a result of the determination in Step S3, a signal indicating abnormality (hereinafter also referred to as an interrupt signal) is output to the circuit 60 from the circuit 50 (Step S6). Then, the circuit 60 that has received the interrupt signal controls the circuit 70 and the circuit 70 transmits a signal indicating that the abnormality is acquired to the outside (Step S7).

Also in the case where the biological data is abnormal, data processing (Step S8) that is similar to that in the case where the biological data is normal and data storing (Step S9) in the circuit 80 can be performed. At this time, a value of the biological data that is determined to be an abnormal value, time at which the abnormal value is acquired, and the like can be stored in the circuit 80. The above-described data can be transmitted to the outside from the circuit 70.

As described above, in one embodiment of the present invention, the circuit 50 can be used as a memory circuit with a function of performing an arithmetic operation. The circuit 50 can output to the circuit 60 data stored in the circuit 50, data input from the circuit 40, and data obtained as a result of the arithmetic operation using these data as an input signal. The circuit 50 can perform the arithmetic operation that is essentially performed in the circuit 60, thus, a burden of the arithmetic operation on the circuit 60 can be reduced. Further, the number of times of data transmission and reception between the circuits 50 and 60 can be reduced. Thus, the operation speed of the semiconductor device 10 can be improved.

Further, in one embodiment of the present invention, a structure can be employed in which one of the circuit 80 and the circuit 90 has a region overlapping with at least part of the other of the circuit 80 and the circuit 90. Thus, the circuit 50 which functions as a memory circuit can have an additional function of performing an arithmetic operation while the increase in the area of the circuit 50 is suppressed. Thus, the area of the semiconductor device 10 can be reduced.

This embodiment can be combined with any of the other embodiments as appropriate. Note that content (or may be part of the content) described in one embodiment may be applied to, combined with, or replaced by different content (or may be part of the different content) described in the embodiment and/or content (or may be part of the content) described in one or more different embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed. This applies also to other embodiments.

(Embodiment 2)

In this embodiment, a specific structure example of one embodiment of the present invention is described. Here, a structure of the semiconductor device 10 having a function as a healthcare system which determines whether the acquired biological data is normal or abnormal is described.

Figure 5:
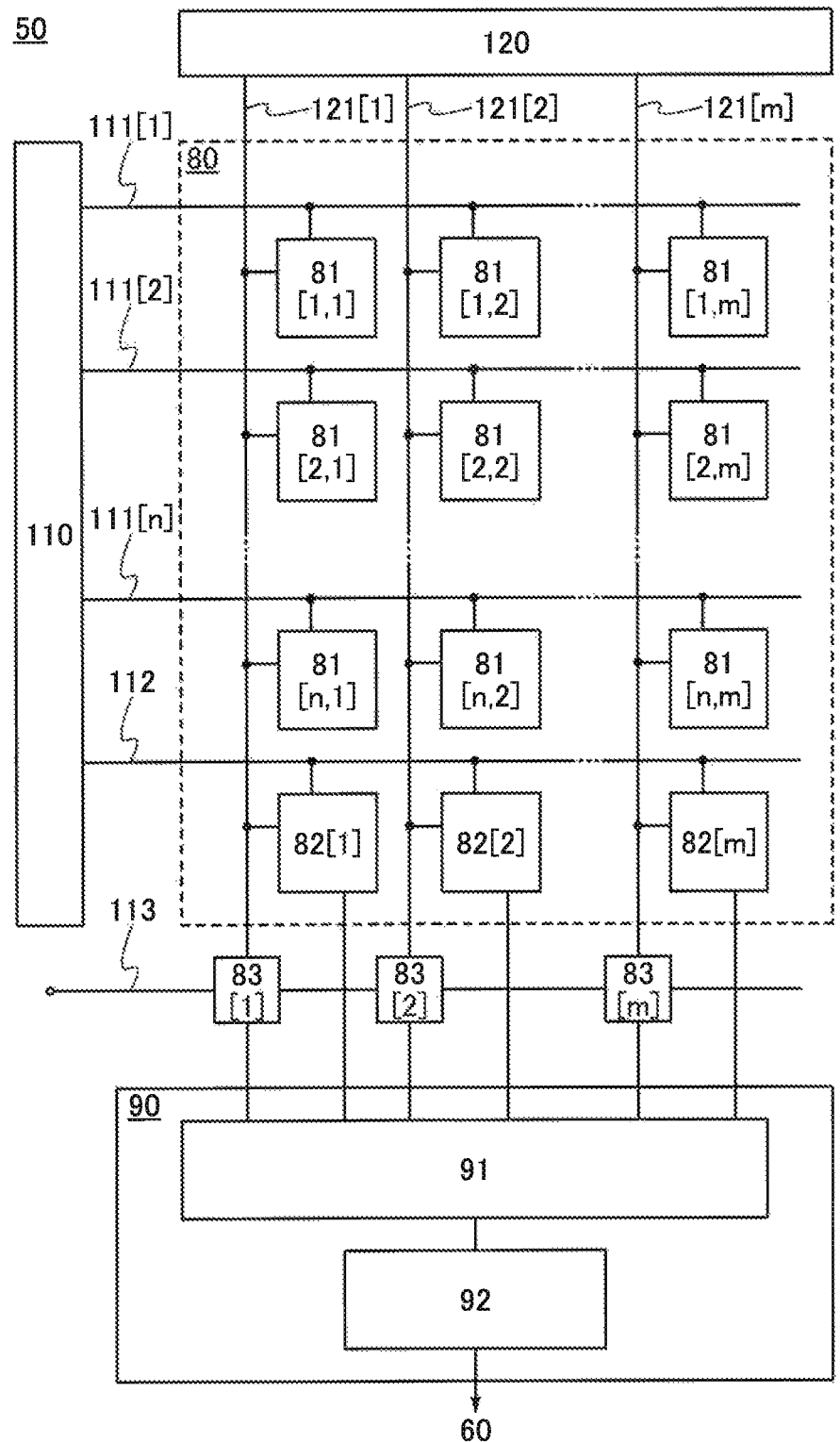
FIG. 5 illustrates an example of a structure of a semiconductor device.

FIG. 5 illustrates an example of the structure of the circuit 50. The circuit 50 includes the circuits 80, 90, 110, 120, and a plurality of circuits 83. Note that the circuits 80 and 90 are formed on the same surface in FIG. 5 for the convenience of explanation; however, the circuits 80 and 90 are formed so as to overlap with each other as shown in FIGS. 1A to 1C, FIGS. 2A and 2B, and FIGS. 3A to 3D.

The circuit 80 includes a plurality of memory circuits 81 and a plurality of memory circuits 82. Here, a structure is shown in which the circuit 80 includes n rows and m columns (m and n are natural numbers) of memory circuits 81 (memory circuits 81 [1, 1] to [n, m]) and one row and m columns of memory circuits 82 (memory circuits 82 [1] to [m]). Note that two or more columns of memory circuits 82 may be provided. The memory circuits 81 and the memory circuits 82 function as memory cells, and the circuit 80 functions as a cell array including a plurality of memory cells.

Here, the circuit 80 includes n rows and m columns of memory circuits 81; thus, n kinds of m-bit data can be stored. Thus, n kinds of values of m-bit biological data acquired at different times and under different conditions can be stored. Note that the number of the columns (m) of the memory circuit 81 can be freely determined depending on biological data to be acquired. For example, in the case of acquiring a blood sugar level as biological data, numerical values in the range where the blood sugar level (BS) is 0 to 255 (mg/dl) can be stored when m is eight.

The memory circuits 81 are preferably formed using OS transistors. In that case, biological data stored in the memory circuits 81 can be held for a long period, and the memory circuits 81 can be used as nonvolatile memory cells or memory cells with an extremely low refresh frequency.

Furthermore, one kind of m-bit data can be stored in one row and m columns of memory circuits 82 included in the circuit 80. Here, in the memory circuits 82 [1] to [m], m-bit data that is a reference value of biological data can be stored. This reference value can be, for example, the value of a border between a normal value and an abnormal value (the upper limit or the lower limit of the normal value) of the biological data. For example, when the blood sugar level (BS) is acquired as biological data, the upper limit where the blood sugar level (BS) is 126 mg/dl of the normal value can be stored.

An example is described in which the memory circuits 82 are provided in one row; however, the memory circuits 82 may be provided in a plurality of rows. In that case, because a plurality of reference values can be stored, the upper limit and the lower limit of the biological data, or a plurality of upper limits or a plurality of lower limits can be stored in the memory circuits 82. Note that the number of rows of the memory circuits 82 is not specifically limited, and an arbitrary number which is one or more can be selected.

For example, when a blood sugar level is acquired as biological data, the memory circuits 82 are provided in three rows and m columns, and a first upper limit (e.g., BS=110 (mg/dl)), a second upper limit (e.g., BS=116 (mg/dl)), and a third upper limit (e.g., BS=126 (mg/dl)) can be stored in the first row, the second row, and the third row of the memory circuits 82, respectively. Thus, the acquired blood sugar level can be compared with the first to the third upper limits, and abnormality of the biological data can be determined in stages.

In particular, the memory circuit 82 is preferably formed using an OS transistor. The OS transistor has extremely low off-state current; thus, the use of the OS transistor for the memory circuit 82 allows data stored in the memory circuit 82 to be held for a long period even after the supply of power to the circuit 80 is stopped. Thus, the memory circuit 82 can be used as a nonvolatile memory cell or a memory cell with an extremely low refresh frequency. Thus, after writing of the reference value to the memory circuit 82 is performed once, the reference value can be held for a long period even in a period during which the supply of power to the circuit 80 is stopped.

The circuit 110 is connected to the memory circuits 81 through a plurality of wirings 111 (wirings 111 [1] to [n]). Further, the circuit 110 is connected to the memory circuits 82 through a wiring 112. The circuit 110 is a driver circuit which has a function of supplying a selection signal to the wirings 111 or the wiring 112.

The circuit 120 is connected to the memory circuits 81 and the memory circuits 82 through a plurality of wirings 121 (wirings 121 [1] to [m]). The circuit 120 is a driver circuit which has a function of supplying to the wiring 121 a potential corresponding to data to be written to the memory circuits 81 or the memory circuits 82 and a function of reading out data stored in the memory circuits 81 or the memory circuits 82 in accordance with the potential of the wiring 121. Note that the circuit 120 may have a precharge function of supplying a predetermined potential to the wiring 121.

Each of the plurality of circuits 83 (the circuits [1] to [m]) is connected to the wiring 113, the wiring 121, and the circuit 90. Each circuit 83 has a function as a switch which controls output of data stored in the memory circuits 81 to the circuit 90. The conduction state of the circuit 83 is controlled with a potential of the wiring 113, and the circuit 83 is brought into a conduction state when an arithmetic operation is performed in the circuit 90.

The circuit 83 can be formed using a transistor, for example. When the circuit 83 is formed using a transistor, a gate of the transistor is connected to the wiring 113, one of a source and a drain thereof is connected to the wiring 121, and the other of the source and the drain thereof is connected to the circuit 90. In that case, the on/off state of the transistor is controlled with a potential of the wiring 113. When the transistor is turned on, the data stored in the memory circuits 81 is output to the circuit 90, and an arithmetic operation can be performed in the circuit 90.

When the circuit 83 is formed using a transistor, an OS transistor can be used. The OS transistors have extremely low off-state current; thus, charge transfer between the wiring 121 and the circuit 90 can be drastically suppressed in a period where the arithmetic operation is not performed in the circuit 90, that is, in a period when the OS transistor is turned off.

Note that a "source" of a transistor in this specification means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

The circuit 90 includes circuits 91 and 92. The circuit 91 is a circuit which has a function of performing an arithmetic operation, and includes one or more arithmetic circuits. The arithmetic circuit can be formed using a logic circuit such as a NOT circuit, an AND circuit, an OR circuit, a NAND circuit, a NOR circuit, an XOR circuit, or an XNOR circuit. Further, a comparison circuit, an adder circuit, a subtractor circuit, a multiplier circuit, a divider circuit, or the like may be formed by combining any of these logic circuits. Here, the case where the circuit 91 includes the comparison circuit is described.

The circuit 91 is connected to the memory circuits 82, the circuits 83, and the circuit 92. To the circuit 91, data stored in the memory circuit 81 is input through the circuits 83, and data stored in the memory circuit 82 is input. The circuit 91 has a function of comparing the sizes of these data, and outputting a signal corresponding to the comparison result to the circuit 92. For example, the circuit 91 can compare data stored in any of the memory circuits 81 [1, 1] to [n, 1] and data stored in the memory circuits 82 [1].

Here, the value of biological data acquired by the circuit 20 (see FIGS. 1A and 1B) is stored in the memory circuits 81, and a predetermined reference value is stored in the memory circuits 82. The circuit 91 can compare the value of m-bit biological data stored in memory circuits 81 in a specific row and the value of m-bit reference value stored in the memory circuits 82. Accordingly, whether the acquired biological value is normal or abnormal can be determined. For example, when the value of the biological data stored in the memory circuits 81 is greater than or equal to the reference value stored in the memory circuits 82, it is determined that the acquired biological data is abnormal.

The circuit 92 has a function of outputting an interrupt signal to the circuit 60 (see FIG. 1) when the biological data is determined to be abnormal as a result of the comparison in the circuit 91. For example, the circuit 92 outputs data "1" when the biological data is normal, and outputs data "0" as an interrupt signal when the biological data is abnormal. When the data "0" is output to the circuit 60, the circuit 70 is controlled by the circuit 60, and a signal indicating that the biological data is abnormal is transmitted from the circuit 70 to the outside.

Note that the plurality of circuits 83 may be provided in the same layer as the circuit 90 (over the substrate 100 in FIG. 1C, and FIGS. 2A and 2B), or in the same layer as the circuit 80 (over the insulating layer 101 in FIG. 1C, and FIGS. 2A and 2B). In the case of using OS transistors for the circuits 83, the circuits 83 are preferably formed in the same layer as the circuit 80. In this case, the OS transistors included in the circuits 83 and the OS transistors included in the memory circuits 81 and the memory circuits 82 can be manufactured through the same process.

Figure 6A:
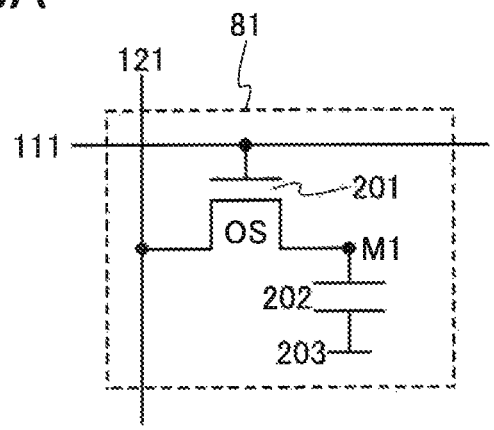
FIGS. 6A to 6C are circuit diagrams each illustrating an example of a structure of a semiconductor device.
Figure 6B:
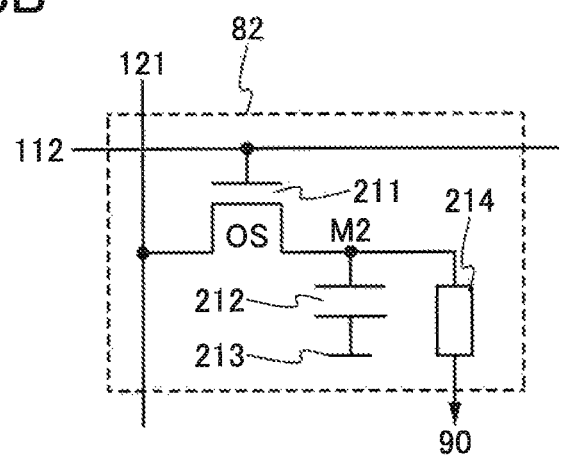
Figure 6C:
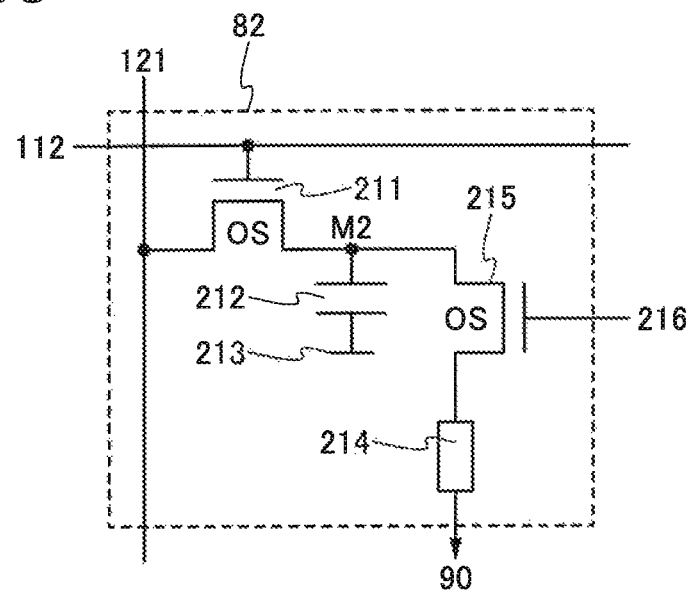

FIGS. 6A to 6C illustrate specific structural examples of the memory circuit 81 and the memory circuit 82.

FIG. 6A illustrates a structural example of the memory circuit 81. The memory circuit 81 includes a transistor 201 and a capacitor 202. A gate of the transistor 201 is connected to the wiring 111, one of a source and a drain thereof is connected to the wiring 121, and the other of the source and the drain is connected to a node M1. One electrode of the capacitor 202 is connected to the node M1, and the other electrode of the capacitor 202 is connected to the wiring 203. Note that without limitation to the case where the transistor 201 is an n-channel transistor, the transistor 201 may be either an n-channel transistor or a p-channel transistor. The wiring 203 may be either a high potential power supply line or a low potential power supply line (such as a ground line). Biological data can be stored in the memory circuit 81.

Thus, an OS transistor is used as the transistor 201. The transistor marked with a symbol "OS" in the drawing is an OS transistor (the same applies hereafter). The OS transistor has extremely low off-state current; thus, the potential of the node M1 can be held for a long time in a period where the transistor 201 is turned off. Thus, the memory circuit 81 can be used as a nonvolatile memory cell or a memory cell with an extremely low refresh frequency.

The OS transistor can operate at a high speed when miniaturized. Thus, the operation speed of the memory circuit 81 can be improved by the use of the OS transistor as the transistor 201.

Next, operation of the memory circuit 81 illustrated in FIG. 6A is described.

First, writing potential is supplied to the wiring 121. After the potential of the wiring 203 is kept at a constant potential, the potential of the wiring 111 is set to a potential at which the transistor 201 is turned on, so that the transistor 201 is turned on. Accordingly, the potential of the wiring 121 is supplied to the node M1 (data writing).

Next, the potential of the wiring 111 is set to a potential at which the transistor 201 is turned off, so that the transistor 201 is turned off This makes the node M1 floating, and the potential of the node M1 is held (data holding). Since the transistor 201 is an OS transistor with extremely small off-state current, the potential of the node M1 can be held for a long time.

After the wiring 121 is set in a floating state and the potential of the wiring 203 is kept at a constant potential, the potential of the wiring 111 is set to a potential at which the transistor 201 is turned on, so that the transistor 201 is turned on. Accordingly, the potential of the node M1 is supplied to the wiring 121. At this time, the potential of the wiring 121 varies depending on the potential of the node M1. Data stored in the memory circuit 81 can be read out by reading the potential of the wiring 121 at this time.

Rewriting of data can be performed in a manner similar to that of the writing and holding of the data.

FIG. 6B illustrates a structural example of the memory circuit 82. The memory circuit 82 includes a transistor 211, a capacitor 212, and a circuit 214. A gate of the transistor 211 is connected to the wiring 112, one of a source and a drain thereof is connected to the wiring 121, and the other of the source and the drain thereof is connected to a node M2. One electrode of the capacitor is connected to the node M2 and the other electrode thereof is connected to a wiring 213 to which a predetermined potential is supplied. An input terminal of the circuit 214 is connected to the node M2, and an output terminal thereof is connected to the circuit 90. Note that the transistor 211 is an OS transistor. Without limitation to the case where the transistor 211 is an n-channel transistor, the transistor 211 may be either an n-channel transistor or a p-channel transistor. The wiring 213 may be either a high potential power supply line or a low potential power supply line (such as a ground line).

In the memory circuit 82, data writing, data holding, and data rewriting can be performed in a manner similar to that in the memory circuit 81 in FIG. 6A. In the memory circuit 82, a reference value for being compared with the value of the biological data stored in the memory circuit 81 can be stored.

Furthermore, the memory circuit 82 can output data corresponding to a potential held in the node M2 to the circuit 90 through the circuit 214. Here, the circuit 214 is not specifically limited as long as it has a function of outputting a signal corresponding to the potential of the node M2 while keeping the potential of the node M2. For the circuit 214, a logic element such as an inverter or an analog switch can be used, for example. In the case of using an inverter for the circuit 214, an input terminal of the inverter is connected to the node M2, and an output terminal thereof is connected to the circuit 90. For the arithmetic operation in the circuit 90, an inverted signal of a signal output from the output terminal of the inverter can be used.

As illustrated in FIG. 6C, the memory circuit 82 may include a transistor 215. A gate of the transistor 215 is connected to a wiring 216, one of a source and a drain thereof is connected to the node M2, and the other of the source and the drain thereof is connected to the input terminal of the circuit 214. Note that the transistor 215 is an OS transistor.

The wiring 216 is a wiring to which a signal for turning on the transistor 215 is supplied when a comparison operation is performed in the circuit 90. Thus, a signal synchronized with a signal supplied to the wiring 113 in FIG. 5 can be supplied to the wiring 216. For example, the wiring 216 may be connected to the wiring 113; alternatively, the wiring 113 may be directly connected to the gate of the transistor 215. Further alternatively, an inverted signal of the wiring 113 may be supplied to the wiring 216.

When the comparison operation is performed in the circuit 90, the transistor 215 is turned on. In a period during which the comparison operation is not performed in the circuit 90, the transistor 215 is off. Here, since the transistor 215, which is an OS transistor, has extremely small off-state current, the potential of the node M2 can be prevented from leaking to the circuit 90 through the circuit 214. Thus, the potential held in the node M2 can be held for a long period.

Figure 7A:
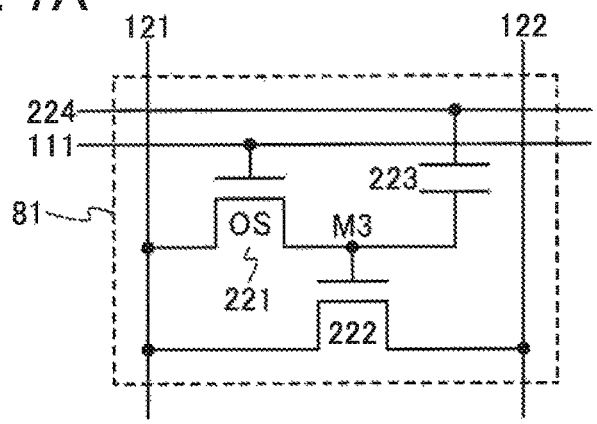
FIGS. 7A to 7C are circuit diagrams each illustrating an example of a structure of a semiconductor device.
Figure 7B:
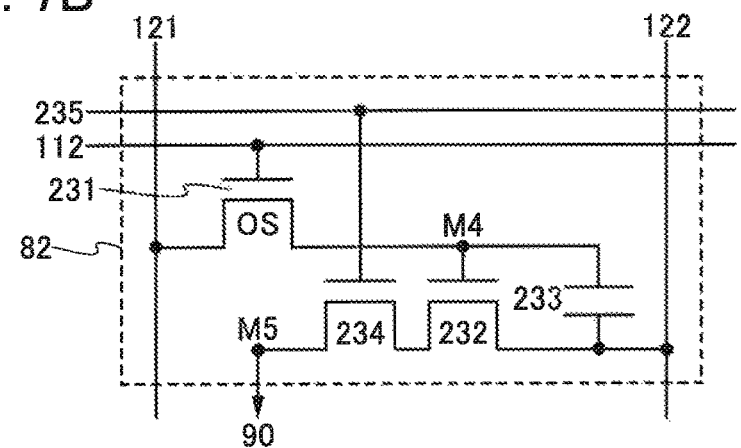
Figure 7C:
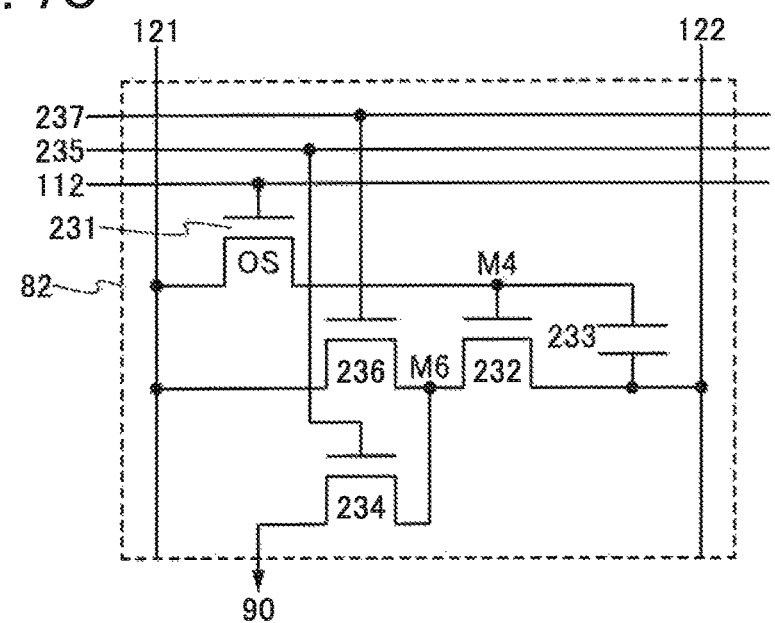

Next, FIGS. 7A to 7C show another structural examples of the memory circuit 81 and the memory circuit 82.

FIG. 7A illustrates another structural example of the memory circuit 81. The memory circuit 81 includes a transistor 221, a transistor 222, and a capacitor 223. A gate of the transistor 221 is connected to the wiring 111, one of a source and a drain thereof is connected to the wiring 121, and the other of the source and the drain thereof is connected to a node M3. A gate of the transistor 222 is connected to the node M3, one of a source and a drain thereof is connected to the wiring 121, and the other of the source and the drain thereof is connected to the wiring 122. One electrode of the capacitor 223 is connected to the node M3 and the other electrode thereof is connected to a wiring 224 to which a predetermined potential is supplied. Here, an OS transistor is used as the transistor 221. Note that the wiring 122 is connected to the circuit 120 (see FIG. 5).

Note that without limitation to the case where the transistor 221 and the transistor 222 are n-channel transistors, each of the transistor 221 and the transistor 222 may be either an n-channel transistor or a p-channel transistor. The wiring 224 may be a high potential power supply line or a low potential power supply line (such as a ground line).

For the transistor 222, a transistor including a single crystal semiconductor in its channel formation region can be used. In that case, current supply capability of the transistor 222 can be improved, resulting in high-speed operation of the memory circuit 81. For the transistor 222, an OS transistor can be used. In that case, the transistor 222 and the transistor 221 can be formed in the same process.

Next, operation of the memory circuit 81 illustrated in FIG. 7A will be described.

After the potential of the wiring 111 is set to a potential at which the transistor 221 is turned on, the transistor 221 is turned on. Accordingly, the potential of the wiring 121 is supplied to the node M3. That is, a predetermined charge is supplied to the gate electrode of the transistor 222 (data writing).

After that, the potential of the wiring 111 is set to a potential at which the transistor 221 is turned off, so that the transistor 221 is turned off. This makes the node M3 floating, and the potential of the node M3 is held (data holding).

After the potential of the wiring 122 is kept at a constant potential, the potential of the wiring 224 is set to a predetermined potential (a reading potential), so that the potential of the wiring 121 varies depending on the amount of the charge held in the node M3. This is because in general, in the case where the transistor 222 is an n-channel transistor, an apparent threshold voltage $V_{th\_H}$ when the potential of the gate of the transistor 222 is high is lower than an apparent threshold voltage $V_{th\_L}$ when the potential of the gate of the transistor 222 is low. Here, an apparent threshold voltage refers to the potential of the wiring 224 that is needed to turn on the transistor 222. Thus, by setting the potential of the wiring 224 to a potential $V_0$ which is between $V_{th\_H}$ and $V_{th\_L}$, the potential of the node M3 can be determined. For example, in the case where the potential of the node M3 is a high level, the transistor 222 is turned on when the potential of the wiring 224 becomes $V_0$ ($>V_{th\_H}$). In the case where the potential of the node M3 is a low level, the transistor 222 remains off even when the potential of the wiring becomes $V_0$ ($<V_{th\_L}$). Thus, the data stored in the memory circuit 81 can be read out by reading out the potential of the wiring 121.

In the case where data reading is not performed, a potential at which the transistor 222 is turned off regardless of the potential of the node M3, that is, a potential lower than $V_{th\_H}$ is supplied to the wiring 224.

Rewriting of data can be performed in a manner similar to that of the writing and holding of the data.

Note that one of the source and the drain of the transistor 221 is electrically connected to the gate of the transistor 222, and thereby has an effect similar to that of a floating gate of a floating-gate transistor which is used as a non-volatile memory element. Thus, the node M3 is referred to as a floating gate portion FG in some cases. When the transistor 221 is off, the floating gate portion FG can be regarded as being embedded in an insulator and charge is held in the floating gate portion FG. The off-state current of the transistor 221 is less than or equal to 1/100,000 of the off-state current of a transistor including a single crystal semiconductor in its channel formation region; thus, loss of the charge accumulated in the floating gate portion FG due to leakage current of the transistor 221 is extremely small. Alternatively, loss of the charge accumulated in the floating gate portion FG is negligible for a long period. As a result, with the use of the transistor 221 that is an OS transistor, a nonvolatile memory device or a memory device capable of retaining data for a long period without power supply can be realized.

In the memory circuit 81, data can be directly rewritten by another writing of data. For that reason, erasing operation which is needed in a flash memory or the like is not needed, whereby a reduction in operation speed caused by erasing operation can be suppressed. That is, high-speed operation of the semiconductor device can be realized.

Further, in that case, the problem of deterioration of a gate insulating film (tunnel insulating film), which is pointed out in a conventional floating gate transistor, does not exist. That is to say, the deterioration of a gate insulating film due to injection of an electron into a floating gate, which has been traditionally regarded as a problem, can be neglected. This means that there is no limit on the number of times of writing in principle. Furthermore, a high voltage needed for writing or erasing in a conventional floating gate transistor is not necessary.

The OS transistor can operate at a high speed when miniaturized. Thus, the operation speed of the memory circuit 81 can be improved by the use of the OS transistor as the transistor 201.

FIG. 7B illustrates another structural example of the memory circuit 82. The memory circuit 82 includes a transistor 231, a transistor 232, a capacitor 233, and a transistor 234. A gate of the transistor 231 is connected to the wiring 112, one of a source and a drain thereof is connected to the wiring 121, and the other of the source and the drain thereof is connected to a node M4. A gate of the transistor 232 is connected to the M4, one of a source and a drain thereof is connected to the wiring 122, and the other of the source and the drain thereof is connected to one of a source and a drain of the transistor 234. One electrode of the capacitor 233 is connected to the node M4 and the other electrode thereof is connected to the wiring 122. A gate of the transistor 234 is connected to the wiring 235, and the other of the source and the drain thereof is connected to a node M5. Thus, an OS transistor is used as the transistor 231. Note that the wiring 122 is connected to the circuit 120 (see FIG. 5)

Operation of the memory circuit 82 illustrated in FIG. 7B will be described.

First, the potential of the wiring 112 is set to a potential at which the transistor 231 is turned on, so that the transistor 231 is turned on. Accordingly, the potential of the wiring 121 is supplied to the node M4. That is, a predetermined potential is supplied to the gate electrode of the transistor 232 (data writing).

After that, the potential of the wiring 112 is set to a potential at which the transistor 231 is turned off, so that the transistor 231 is turned off. This makes the node M4 floating, and the potential of the node M4 is held (data holding)

After that, a potential at which the transistor 234 is turned on (hereinafter also referred to as a reading potential) is supplied to the wiring 235 while a constant potential is supplied to the wiring 122, so that the transistor 234 is turned on. At this time, the potential of the node M5 varies depending on the amount of charge held in the node M4. This is because the transistor 234 is turned on in the case where the potential of the node M4 is high and is turned off in the case where the potential of the node M4 is low. As described above, the potential of the node M5 depending on the potential of the node M4 is supplied to the circuit 90.

Note that the structure of the memory circuit 82 that is changed by connecting the node M5 to the wiring 121 can be used as the structure of the memory circuit 81.

A reading potential is supplied to the wiring 235 when a comparison operation is performed in the circuit 90. This reading potential can be synchronized with the potential of the wiring 113 in FIG. 5. For example, the wiring 235 may be connected to the wiring 113, or the wiring 113 may be directly connected to the gate of the transistor 234. Furthermore, an inverted signal of the wiring 113 may be supplied to the wiring 235.

When the comparison operation is performed in the circuit 90, a reading potential is supplied to the wiring 235, so that the transistor 234 is turned on. When the transistor 234 is turned on, a potential corresponding to the potential of the node M4 is supplied from the node M5 to the circuit 90. In a period during which the comparison operation is not performed in the circuit 90, a potential at which the transistor 234 is turned off is supplied to the wiring 235.

The memory circuit 82 may have a structure shown in FIG. 7C. FIG. 7C is different from FIG. 7B in that the memory circuit 82 includes a transistor 236.

A gate of the transistor 236 is connected to a wiring 237, one of a source and a drain thereof is connected to a node M6, and the other of the source and the drain thereof is connected to the wiring 121.

A potential similar to the potential that is supplied to the wiring 235 in FIG. 7B is supplied to the wiring 235. A potential for controlling on/off of the transistor 236 is supplied to the wiring 237. Accordingly, the data held in the memory circuit 82 can be output not only to the circuit 90 but also to the wiring 121. Then, by reading the potential of the wiring 121 at the time of turning on the transistor 236, data stored in the memory circuit 82 can be read out.

With any of the above-described structures, the reference value of biological data stored in the memory circuit 82 can be held for a long period even in a period during which supply of power to the memory circuit 82 is stopped. Thus, after the reference value is written to the memory circuit 82 once, the reference value can be held for a long period even in a period during which supply of power to the memory circuit 82 is stopped. When the comparison operation is performed in the circuit 90, the reference value stored in the memory circuit 82 can be output to the circuit 90.

Note that the circuit 80 may include the memory circuit 81 illustrated in FIG. 6A and the memory circuit 82 illustrated in FIG. 7B. Alternatively, the circuit 80 may include the memory circuit 81 illustrated in FIG. 7A and the memory circuit 82 illustrated in FIG. 6B or 6C.

Next, a specific structure example of the circuit 90 is described.

Figure 8:
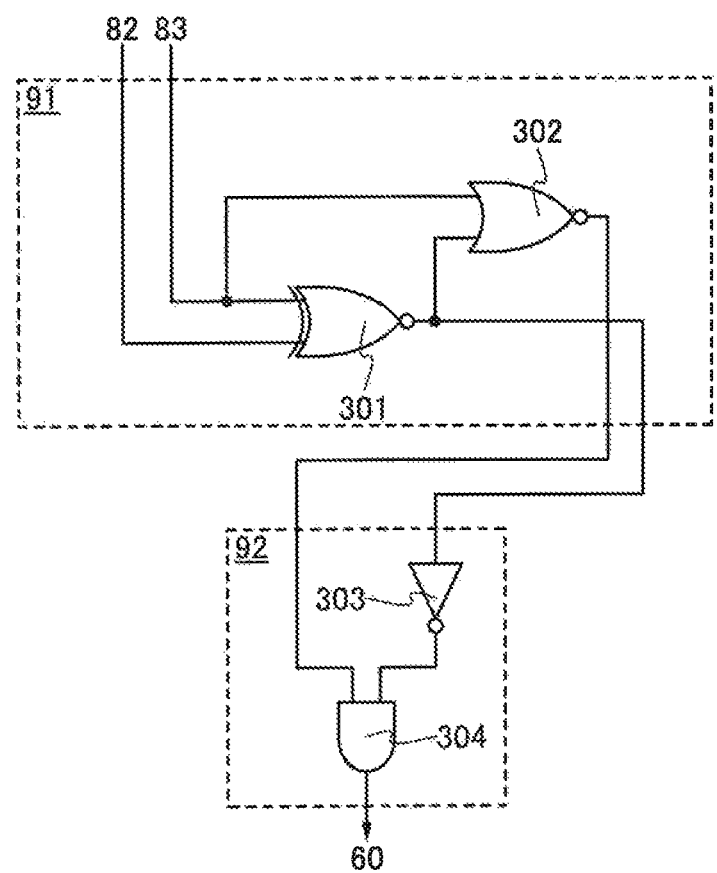
FIG. 8 is a circuit diagram illustrating an example of a structure of a semiconductor device.

FIG. 8 illustrates a specific structure example of the circuit 90. Here, a description is made on a structure of the circuit 90 which has a function of comparing two input data.

The circuit 90 includes the circuit 91 and the circuit 92. The circuit 91 includes an XNOR circuit 301 and a NOR circuit 302. A first input terminal of the XNOR circuit 301 is connected to the circuit 83, and a second input terminal thereof is connected to the memory circuit 82. A first input terminal of the NOR circuit 302 is connected to the circuit 83, and a second input terminal thereof is connected to an output terminal of the XNOR circuit 301. The output terminals of the XNOR circuit 301 and the NOR circuit are connected to the circuit 92.

The circuit 91 includes a comparison circuit. Thus, the value of biological data input from the memory circuit 81 through the circuit 83 and the reference value stored in the memory circuit 82 can be compared with each other, and the result can be output to the circuit 92.

The circuit 92 includes an inverter 303 and an AND circuit 304. An input terminal of the inverter 303 is connected to the output terminal of the XNOR circuit 301. A first input terminal of the AND circuit 304 is connected to the output terminal of the NOR circuit 302, and a second input terminal thereof is connected to an output terminal of the inverter 303.

As a result of the comparison between the value of the biological data in the circuit 91 and the reference value, the circuit 92 outputs data "1" to the circuit 60 when the value of the biological data is less than the reference value, and outputs data "0" to the circuit 60 as an interrupt signal when the value of the biological data is greater than or equal to the reference value. When the interrupt signal is input to the circuit 60, the circuit 70 is controlled by the circuit 60, and a signal indicating that the biological data is abnormal is transmitted from the circuit 70 to the outside.

As described above, the circuit 90 determines whether the biological data is normal or abnormal and outputs the determination result to the circuit 60.

Figure 9:
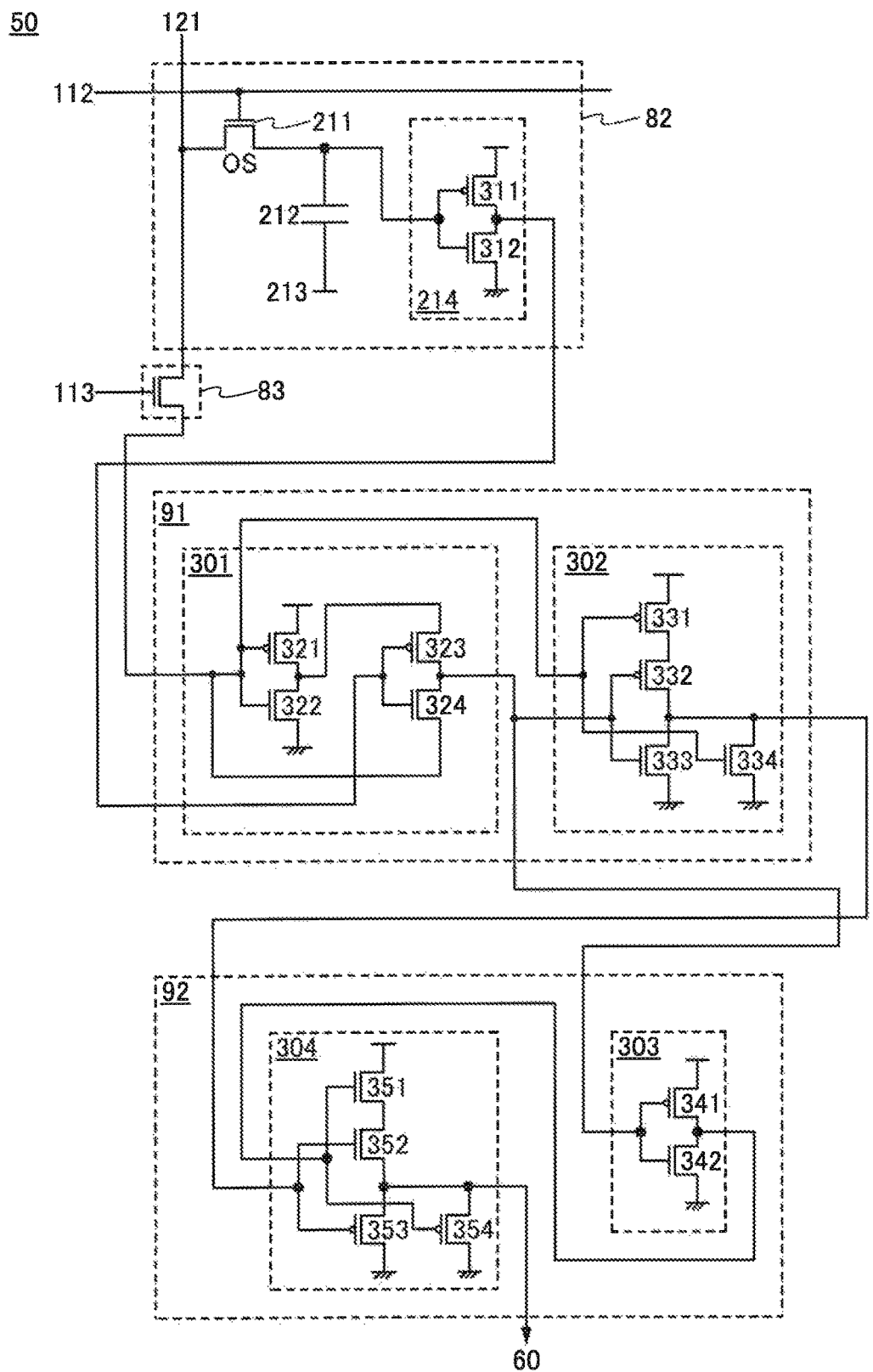
FIG. 9 is a circuit diagram illustrating an example of a structure of a semiconductor device.

FIG. 9 illustrates a more specific structure of the circuit 50. Note that the memory circuit 82 in FIG. 9 corresponds to the structure illustrated in FIG. 6B, and the circuits 91 and 92 in FIG. 9 correspond to the structure illustrated in FIG. 8. An n-channel transistor is used as the circuit 83, and an inverter is used as the circuit 214. Although not shown in the figure, the structure illustrated in FIG. 6A or the like can be used for the memory circuit 81 connected to the wiring 121.

As illustrated in FIG. 9, each of the memory circuit 82, the circuit 91, and the circuit 92 includes an n-channel transistor and a p-channel transistor.

Here, transistors 312, 322, 324, 333, 334, 342, 351, and 352 which are n-channel transistors are OS transistors. Transistors 311, 321, 323, 331, 332, 341, 353, and 354 which are p-channel transistors are transistors including a single crystal semiconductor in their channel formation regions. With such a structure, the n-channel transistors included in the circuit 50 can be formed in the same process as the transistor 211 that is an OS transistor. In manufacturing the transistor 50, it is not necessary to form the n-channel transistors including a single crystal semiconductor in their channel formation regions; thus, the number of manufacturing steps can be reduced.

Here, in each of FIGS. 1A to 1C, FIGS. 2A and 2B, and FIGS. 3A to 3D, the circuit 50 has a structure in which the circuit 90 and the circuit 80 are stacked; however, the circuit 50 may have a structure in which a p-channel transistor and an n-channel transistor are stacked. Specifically, the transistors 311, 321, 323, 331, 332, 341, 353, and 354 that are p-channel transistors can be transistors whose channel formation regions can be formed in part of the substrate 100 in FIG. 1C, FIGS. 2A and 2B, and FIGS. 3A to 3D. The transistors 211, 312, 322, 324, 333, 334, 342, 351, and 352 that are n-channel transistors are OS transistors and can be formed over the insulating layer 101 (see FIG. 1C, FIGS. 2A and 2B) that is provided over the p-channel transistors. Thus, the area of the circuit 50 can be reduced, and manufacturing of an n-channel transistor having a single crystal semiconductor in its channel formation region can be omitted.

Figure 10:
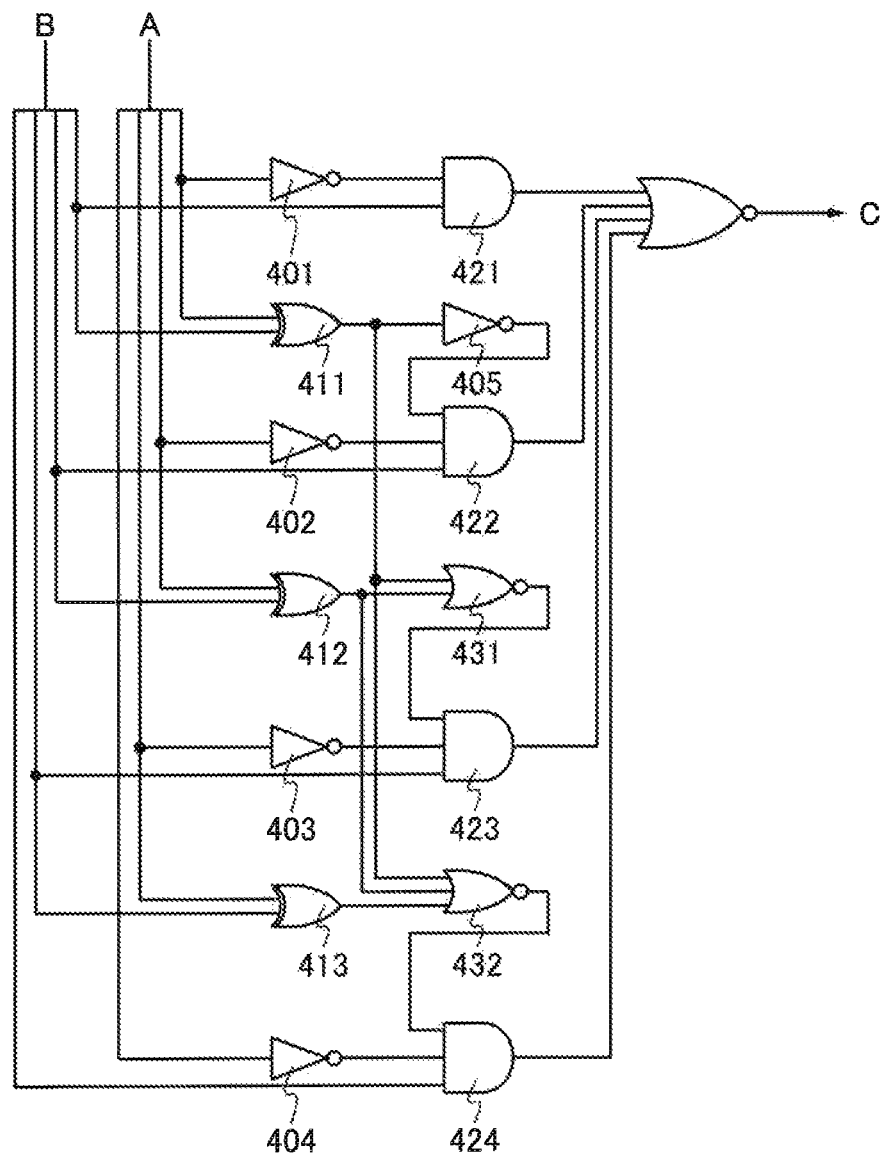
FIG. 10 is a circuit diagram illustrating an example of a structure of a semiconductor device.

Note that description is made on a structure in which the circuit 90 includes a one-bit comparison circuit in FIG. 8 and FIG. 9. When multi-bit data is compared with multi-bit data in the circuit 90, the circuit 90 may have a comparison circuit for multi-bit data. FIG. 10 illustrates an example in which the circuit 90 has a comparison circuit using four-bit data as an input signal.

The circuit 90 includes inverters 401 to 405, XOR circuits 411 to 413, AND circuits 421 to 424, and NOR circuits 431 and 432. The connection relation of the circuits is clear from FIG. 10; thus, detailed description is omitted.

Here, data stored in four memory circuits 81 of the plurality of memory circuits 81 in the same row (see FIG. 5) is input to wirings A as four-bit biological data, and data stored in four memory circuits 82 in the plurality of memory circuits 82 is input to wirings B as a four-bit reference value.

Then, the value of the biological data and the reference value are compared with each other in the circuit 90. When the value of the biological data is less than the reference value, data "0" is output from a wiring C, and when the value of the biological data is greater than or equal to the reference value, data "1" is output from the wiring C. As described above, in the circuit 90 illustrated in FIG. 10, multi-bit biological data can be compared with multi-bit reference value.

Figure 11A:
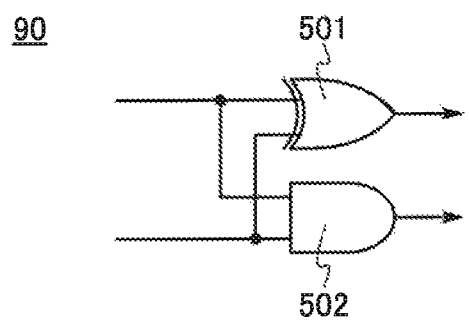
FIGS. 11A and 11B are circuit diagrams each illustrating an example of a structure of a semiconductor device.
Figure 11B:
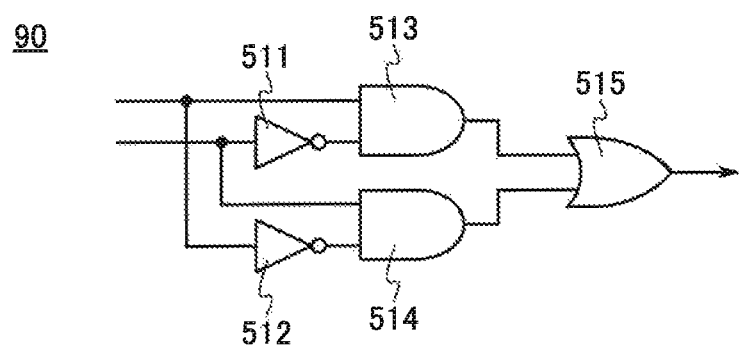

In FIG. 8, FIG. 9, and FIG. 10, description is made on an example in which the circuit 90 has the comparison circuit; however, the structure of the present invention is not limited to this. For example, the circuit 90 may have another arithmetic circuit instead of or in addition to the comparison circuit. FIGS. 11A and 11B illustrate examples of another arithmetic circuit that can be used as the circuit 90.

FIG. 11A illustrates an adder circuit including an XOR circuit 501 and an AND circuit 502. FIG. 11B is a subtractor circuit including inverters 511 and 512, AND circuits 513 and 514, and an OR circuit 515. The circuit 90 may have a full adder circuit or a full subtractor circuit formed by a combination of an adder circuit and a subtractor circuit illustrated in FIG. 11. In addition, the circuit 90 may have a divider circuit formed using the full adder circuit or the full subtractor circuit.

The circuit 90 includes the adder circuit and the divider circuit; thus, an average value of the biological data stored in the memory circuit 81 can be calculated. Furthermore, the circuit 90 includes the subtractor circuit, a difference in biological data stored in the memory circuit 81 can be calculated and variation in the biological data can be monitored.

In each of FIGS. 8, 9, 10, and 11A and 11B, description is made on the case where the circuit 90 includes a digital arithmetic circuit; however, the circuit 90 may include an analog arithmetic circuit. FIGS. 12A to 12D each illustrate a structural example of an analog arithmetic circuit using an operational amplifier 520, which can be used for the circuit 90.

Figure 12A:
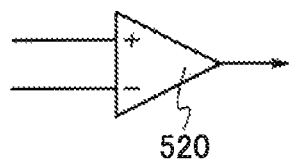
FIGS. 12A to 12D are circuit diagrams each illustrating an example of a structure of a semiconductor device.
Figure 12B:
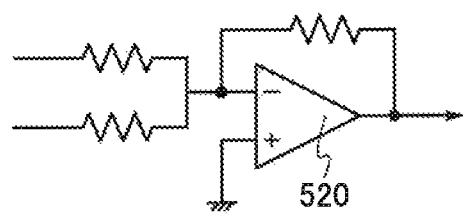
Figure 12C:
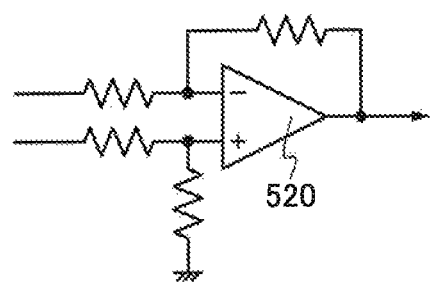
Figure 12D:
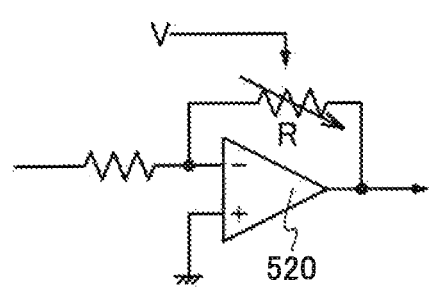

FIG. 12A is a comparison circuit. FIG. 12B is an adder circuit. FIG. 12C is a subtractor circuit. FIG. 12D is a divider circuit. Note that in FIG. 12D, the resistance value of a resistor R is controlled by the potential V.

As described above, in one embodiment of the present invention, the circuit 50 can be used as a memory circuit which has a function of performing an arithmetic operation. Thus, the circuit 50 can output to the circuit 60 data stored in the circuit 50, data input from the circuit 40, and data obtained as the result of an arithmetic operation using aforementioned data as an input signal. Thus, the circuit 50 can perform the arithmetic operation that is essentially performed in the circuit 60, accordingly, a burden of the arithmetic operation on the circuit 60 can be reduced. Furthermore, the number of times of data transmission and reception between the circuits 50 and 60 can be reduced. As a result, the operation speed of the semiconductor device 10 can be improved.

Further, in one embodiment of the present invention, a structure can be employed in which one of the circuit 80 and the circuit 90 has a region overlapping with at least part of the other of the circuit 80 and the circuit 90. Thus, the circuit 50 which functions as a memory circuit can have an additional function of performing an arithmetic operation while the increase in the area of the circuit 50 is suppressed. Thus, the area of the semiconductor device 10 can be reduced.

This embodiment can be combined with any other embodiment as appropriate.

(Embodiment 3)

In this embodiment, the structure of a transistor that can be used in the circuit 50 will be described.

FIGS. 13A to 13D illustrates an example of a method for manufacturing a semiconductor device in which a transistor 620 and a transistor 630 are stacked. Here, the transistor 620 is a transistor including a single crystal semiconductor in its channel formation region and the transistor 630 is an OS transistor.

Figure 13A:
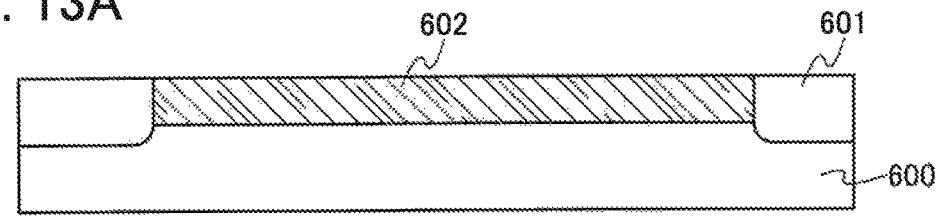
FIGS. 13A to 13D illustrate an example of a structure of a transistor.

First, an element isolation insulator 601 and an n-type well 602 are formed in a semiconductor substrate 600 (FIG. 13A).

Next, a gate insulating film 603 and a gate electrode 604 are formed, and a p-type impurity region 605 is formed in the well 602. A layer which includes a higher conductivity material (such as silicide) than the impurity region 605 may be stacked over the impurity region 605. The impurity region 605 may include an extension region.

Next, an insulating layer 606 is formed. The insulating layer 606 may be a single layer or a multilayer and is preferably capable of supplying oxygen to a layer provided over the insulating layer 606 and blocking the entry of hydrogen or water from a layer provided below the insulating layer 606 to the layer provided over the insulating layer 606. The insulating layer 606 is etched and planarized. The etching and the planarizing are stopped when the gate electrode 604 is exposed. Note that the planarizing of the insulating layer 606 can be performed by chemical mechanical polishing (CMP).

Figure 13B:
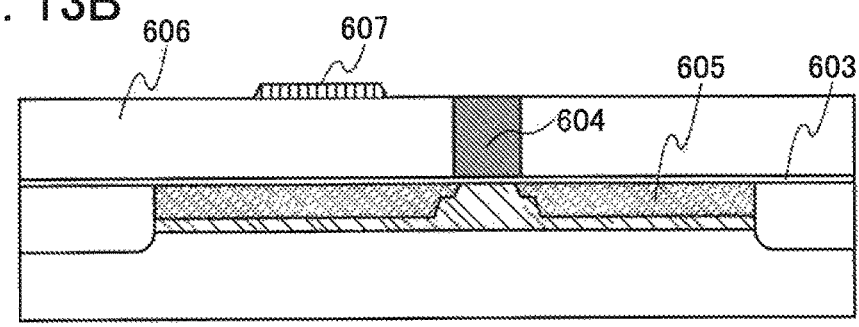

Next, an oxide semiconductor layer 607 is formed over the insulating layer 606 (FIG. 13B). The oxide semiconductor layer 607 can be formed using a material described in Embodiment 4.

Next, a conductive film is formed over the insulating layer 606 and the oxide semiconductor layer 607. The conductive film may be a single layer or a multilayer. Then, the conductive film is etched so as to form a conductive layer 608. The conductive layer 608 has a function as a source electrode or a drain electrode of a transistor which has a channel formation region in the oxide semiconductor layer 607. The conductive layer 608 may be a single layer or a multilayer.

Figure 13C:
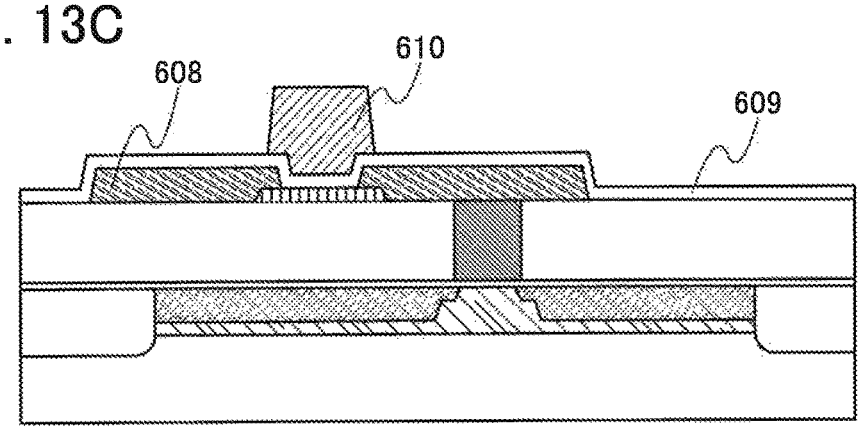

Next, a gate insulating layer 609 is formed to cover the conductive layer 608. Further, a conductive film is formed over the gate insulating film 609. The conductive film may be a single layer or a multilayer. The conductive film is preferably capable of blocking the entry of hydrogen or water from a layer provided over the conductive film to the layer provided below the conductive film. Then, the conductive film is etched so that the gate electrode 610 is formed (FIG. 13C).

Figure 13D:
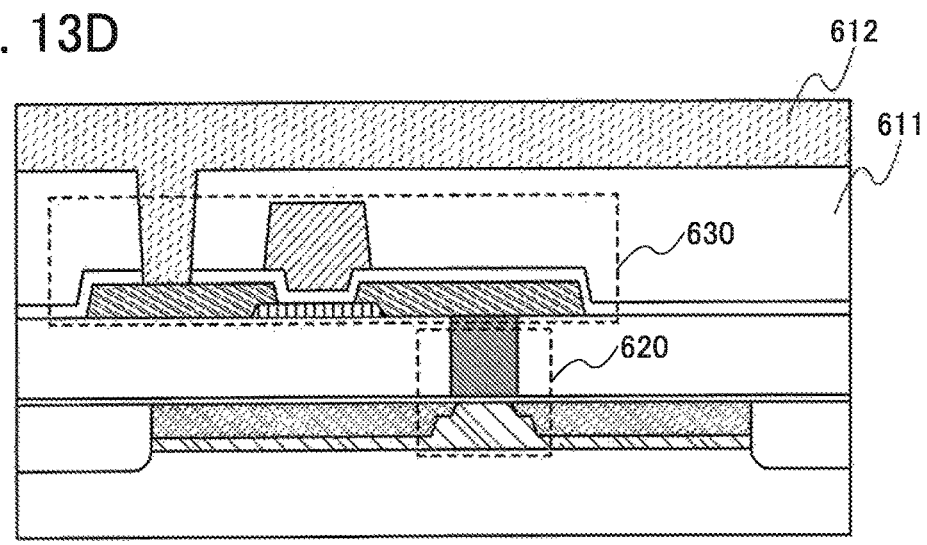

Then, an insulating layer 611 is formed. A contact hole reaching the conductive layer 608 is formed in the insulating layer 611, and then is filled with a conductive material, whereby a wiring 612 is formed (FIG. 13D). Note that a conductive layer in contact with the conductive layer 608 may be formed in the contact hole, so that the conductive layer and the wiring 612 may be in contact with each other. Note that the wiring 612 may be a single layer or a multilayer.

As described-above, the semiconductor device in which the transistor 620 including a single crystal semiconductor in its channel formation region and the transistor 630 that is an OS transistor are stacked can be manufactured.

Note that in FIG. 13D, the gate electrode 604 is connected to the conductive layer 608. That is, a gate of the transistor 620 is connected to one of a source and a drain of the transistor 630. Such a structure can be applied to the circuits in FIGS. 7A to 7C and FIG. 9 as appropriate. For example, the transistor 620 corresponds to the transistors 222, 232, and the like in FIGS. 7A to 7C, and the transistor 630 corresponds to the transistors 221, 231, and the like in FIGS. 7A to 7C. Further, the transistor 620 corresponds to the transistor 321 and the like in FIG. 9, and the transistor 630 corresponds to the circuit (transistor) 83 and the like in FIG. 9.

Figure 14A:
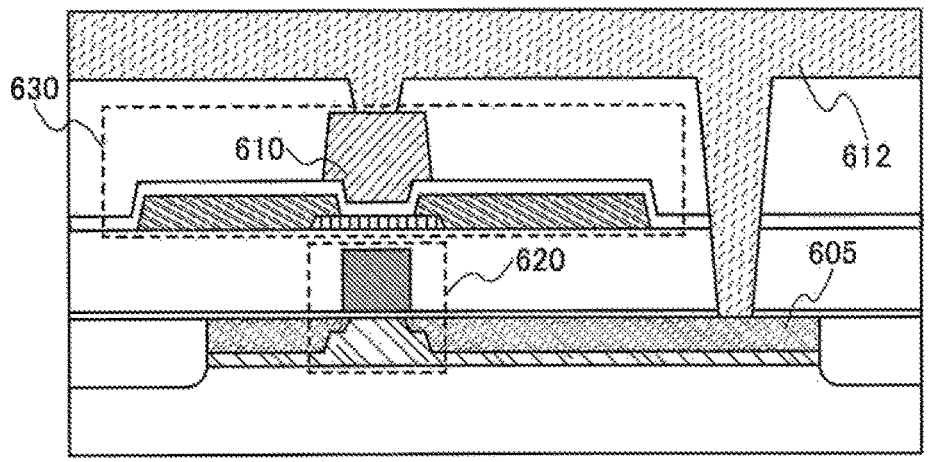
FIGS. 14A to 14C each illustrate an example of a structure of a transistor.

Note that the connection relation between the transistor 620 and the transistor 630 is not limited to that shown in FIG. 13D. For example, as illustrated in FIG. 14A, the impurity region 605 may be connected to the gate electrode 610 through the wiring 612. Accordingly, one of a source and a drain of the transistor 620 may be connected to the gate of the transistor 630. Such a structure can be appropriately used in the circuit illustrated in FIG. 9 and the like. For example, the transistor 620 corresponds to the transistors 311, 332, and the like in FIG. 9, and the transistor 630 corresponds to the transistor 324, 352, and the like in FIG. 9.

Figure 14B:
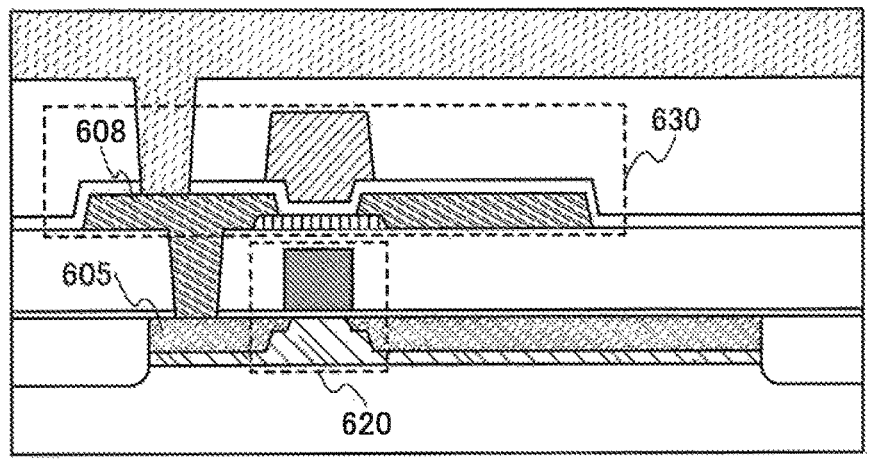

As shown in FIG. 14B, the impurity region 605 may be connected to the conductive layer 608. With this structure, one of a source and a drain of the transistor 620 can be connected to one of a source and a drain of the transistor 630. Such a structure can be appropriately used in the circuit shown in FIG. 9, and the like. For example, the transistor 620 corresponds to the transistor 311 in FIG. 9 and the like, and the transistor 630 corresponds to the transistor 312 in FIG. 9 and the like.

Figure 14C:
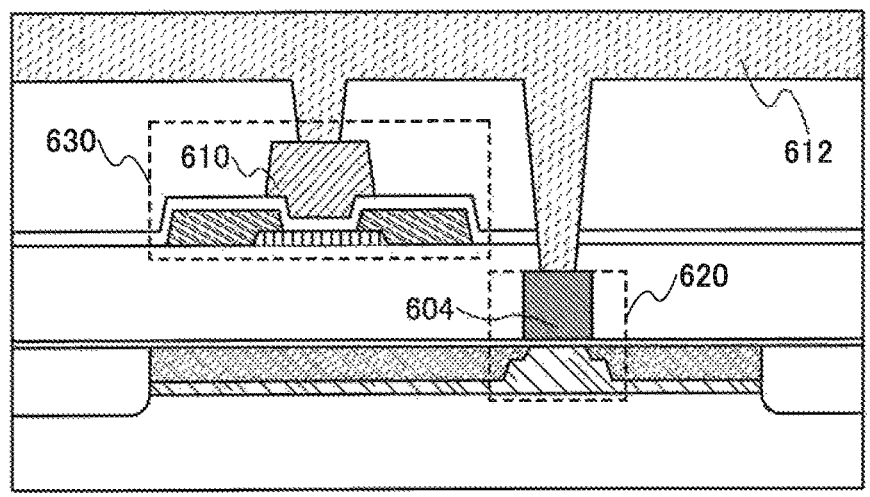

As shown in FIG. 14C, the gate electrode 604 can be connected to the gate electrode 610 through the wiring 612. Accordingly, the gate of the transistor 620 can be connected to the gate of the transistor 630. Such a structure can be appropriately used for the circuit illustrated in FIG. 9 and the like. For example, the transistor 620 corresponds to the transistor 311 illustrated in FIG. 9 and the like, and the transistor 630 corresponds to the transistor 312 illustrated in FIG. 9 and the like. Such a structure is effective particularly in the case where an inverter is formed using an OS transistor and a transistor including a single crystal semiconductor in its channel formation region.

In each of FIG. 13D and FIGS. 14A to 14C, the transistor 620 and the transistor 630 may have mutually overlapping regions with the insulating layer 606 therebetween. For example, as illustrated in FIG. 13D and FIG. 14C, the impurity region 605 of the transistor 620 and the channel formation region of the transistor 630 may have mutually overlapping regions with the insulating layer 606 therebetween. Furthermore, as illustrated in FIGS. 14A and 14B, the channel formation region of the transistor 620 and the channel formation region of the transistor 630 may have mutually overlapping regions with the insulating layer 606 therebetween. Furthermore, the gate electrode 604 of the transistor 620 and the gate electrode 610 of the transistor 630 may have mutually overlapping regions with the insulating layer 606 therebetween. With any of these structures, the integration degree of the transistors can be improved.

The stacked-layer structure of the transistor illustrated in any of FIG. 13D, and FIGS. 14A to 14C can be freely used in any of the circuits shown in FIGS. 1A to 1C, FIGS. 2A and 2B, FIGS. 3A to 3D, FIG. 5, FIGS. 6A to 6C, FIGS. 7A to 7C, FIG. 8, FIG. 9, FIG. 10, FIGS. 11A and 11B, and FIGS. 12A to 12D.

This embodiment can be implemented in appropriate combination with any of the other embodiments and the like.

(Embodiment 4)

In this embodiment, the structures of a transistor that can be used in the memory circuit or a logic circuit will be described.

<Example of Cross-Sectional Structure of Semiconductor Device>

Figure 15:
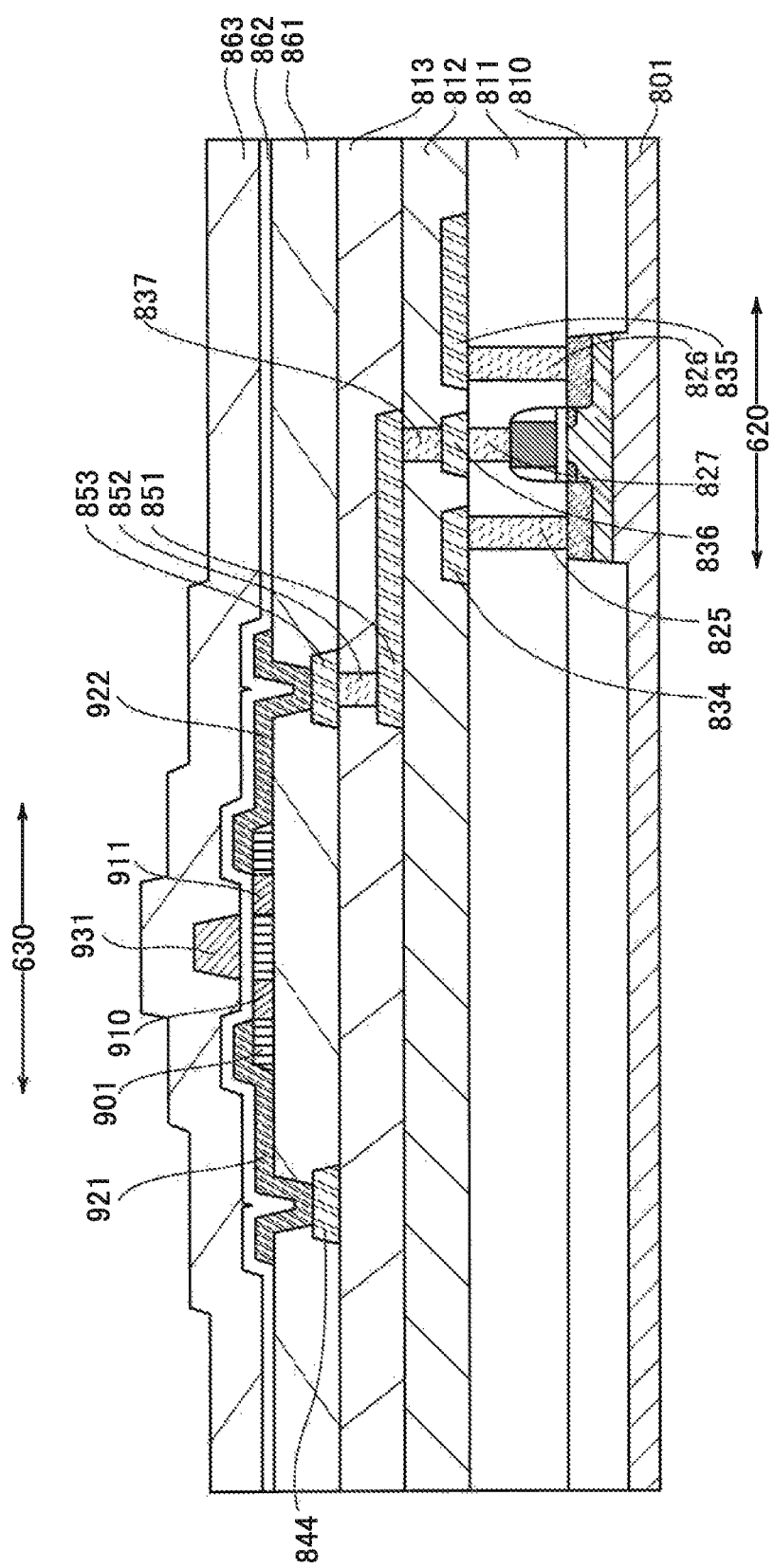
FIG. 15 illustrates an example of a structure of a transistor.

FIG. 15 illustrates a structure example of the transistors 620 and 630. In FIG. 15, the transistor 630 that is an OS transistor is formed over the transistor 620 that is a transistor including a material other than an oxide semiconductor in its channel formation region.

Note that such a structure in which the transistor including a material other than an oxide semiconductor and the OS transistor are stacked can be appropriately used for any of transistors included in the various circuit illustrated in FIGS. 1A to 1C, FIGS. 2A and 2B, FIGS. 3A to 3D, FIG. 5, FIGS. 6A to 6C, FIGS. 7A to 7C, FIG. 8, FIG. 9, FIG. 10, FIGS. 11A and 11B, and FIGS. 12A to 12D.

In this embodiment, as in FIG. 13D, the gate of the transistor 620 is connected to one of the source and the drain of the transistor 630; however, the structure of the present invention is not limited to this. One of the source and the drain of the transistor 620 may be connected to the gate of the transistor 630 (see FIG. 14A), one of the source and the drain of the transistor 620 may be connected to one of the source and the drain of the transistor 630 (see FIG. 14B), or the gate of the transistor 620 may be connected to the gate of the transistor 630 (see FIG. 14C).

The transistor 620 may include its channel formation region in a semiconductor film or a semiconductor substrate of silicon, germanium, or the like in an amorphous, microcrystalline, polycrystalline, or single crystal state. Alternatively, the transistor 620 may include its channel formation region in an oxide semiconductor film or an oxide semiconductor substrate. In the case where channel formation regions of all the transistors are included in an oxide semiconductor film or an oxide semiconductor substrate, the transistor 630 is not necessarily stacked over the transistor 620, and the transistors 630 and 620 may be formed in the same layer.

In the case where the transistor 620 is formed using a thin silicon film, any of the following can be used in the thin film: amorphous silicon formed by a sputtering method or a vapor phase growth method such as a plasma-enhanced chemical vapor deposition (CVD) method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 801 where the transistor 620 is formed can be, for example, a silicon substrate, a germanium substrate, or a silicon germanium substrate. FIG. 15 shows the case where a single crystal silicon substrate is used as the semiconductor substrate 801.

The transistor 620 is electrically isolated by element isolation. As the element isolation method, a local oxidation of silicon (LOCOS) method, a shallow trench isolation (STI) method, or the like can be employed. FIGS. 14A to 14C illustrate an example where the trench isolation method is used to electrically isolate the transistor 620. Specifically, in FIG. 15, the transistor 620 is electrically isolated by element isolation using an element isolation region 810 formed in such a manner that an insulator including silicon oxide or the like is buried in a trench formed in the semiconductor substrate 801 by etching or the like.

An insulating film 811 is provided over the transistor 620. Opening portions are formed in the insulating film 811. Conductive films 825 and 826 that are electrically connected to the source and the drain of the transistor 620 and a conductive film 827 that is electrically connected to the gate of the transistor 620 are formed in the openings.

The conductive film 825 is electrically connected to a conductive film 834 formed over the insulating film 811. The conductive film 826 is electrically connected to a conductive film 835 formed over the insulating film 811. The conductive film 827 is electrically connected to a conductive film 836 formed over the insulating film 811.

An insulating film 812 is formed over the conductive films 834 to 836. An opening is formed in the insulating film 812. A conductive film 837 electrically connected to the conductive film 836 is formed in the opening portion. The conductive film 837 is electrically connected to a conductive film 851 formed over the insulating film 812.

An insulating film 813 is formed over the conductive film 851. An opening is formed in the insulating film 813. A conductive film 852 electrically connected to the conductive film 851 is formed in the opening. The conductive film 852 is electrically connected to a conductive film 853 formed over the insulating film 813. A conductive film 844 is formed over the insulating film 813.

An insulating film 861 is formed over the conductive film 853 and the conductive film 844. In FIG. 15, the transistor 630 is formed over the insulating film 861.

The transistor 630 includes, over the insulating film 861, a semiconductor film 901 including an oxide semiconductor, conductive films 921 and 922 functioning as source and drain over the semiconductor film 901, a gate insulating film 862 over the semiconductor film 901 and the conductive films 921 and 922, and a gate electrode 931 overlapping with the semiconductor film 901 over the gate insulating film 862 and between the conductive films 921 and 922. Note that the conductive film 922 is electrically connected to the conductive film 853 in an opening provided in the insulating film 861.

In the semiconductor film 901 of the transistor 630, there is a region 910 between a region overlapping with the conductive film 921 and a region overlapping with the gate electrode 931. In addition, in the semiconductor film 901 of the transistor 630, there is a region 911 between a region overlapping with the conductive film 922 and the region overlapping with the gate electrode 931. When argon, an impurity which imparts p-type conductivity to the semiconductor film 901, or an impurity which imparts n-type conductivity to the semiconductor film 901 is added to the regions 910 and 911 using the conductive films 921 and 922 and the gate electrode 931 as masks, the resistivity of the regions 910 and 911 can be made lower than that of the region overlapping with the gate electrode 931 in the semiconductor film 901.

An insulating film 863 is provided over the transistor 630.

In FIG. 15, the transistor 630 has the gate electrode 931 on at least one side of the semiconductor film 901; alternatively, the transistor 630 may have a pair of gate electrodes with the semiconductor film 901 positioned therebetween.

In the case where the transistor 630 has a pair of gate electrodes with the semiconductor film 901 positioned therebetween, one of the gate electrodes may be supplied with a signal for controlling the on/off state, and the other of the gate electrodes may be supplied with a potential from another wiring. In this case, potentials at the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 15, the transistor 630 has a single-gate structure where one channel formation region corresponding to one gate electrode 931 is provided. However, the transistor 630 may have a multi-gate structure where a plurality of channel formation regions are formed in one active layer by providing a plurality of gate electrodes electrically connected to each other.

<Transistor>

Then, structure examples of the OS transistor will be described.

Figure 16A:
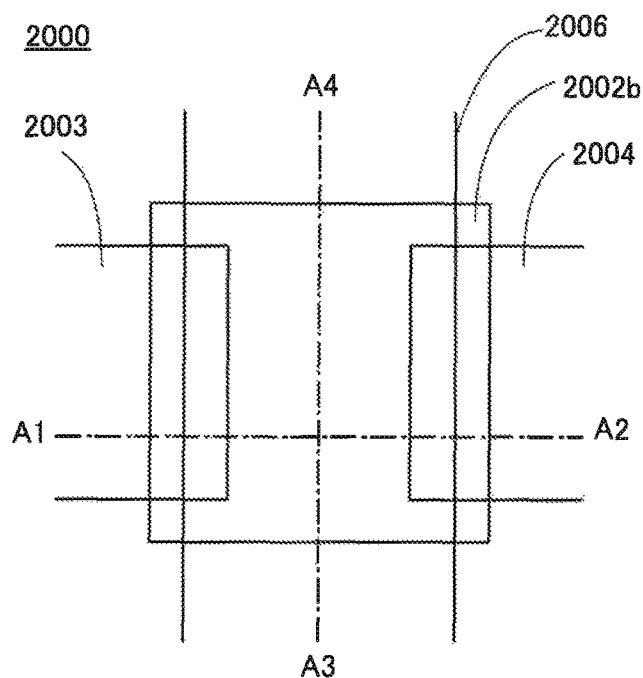
FIGS. 16A to 16C illustrate an example of a structure of a transistor.
Figure 16C:
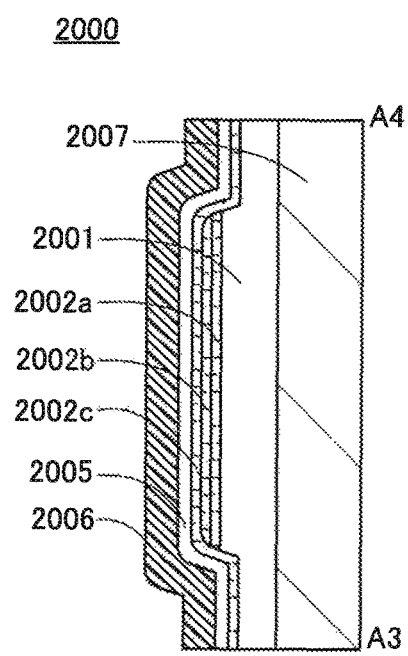
Figure 16B:
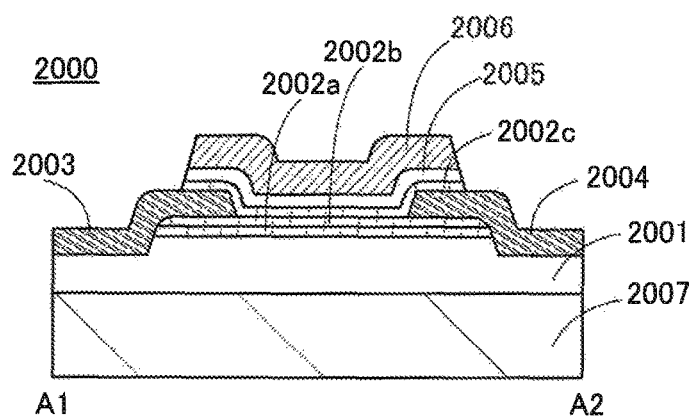

FIGS. 16A to 16C illustrate an example of a transistor 2000 that is an OS transistor. FIG. 16A is a top view of the transistor 2000. Note that insulating films are not illustrated in FIG. 16A in order to clarify the layout of the transistor 2000. FIG. 16B is a cross-sectional view along the dashed-dotted line A1-A2 in the top view in FIG. 16A. FIG. 16C is a cross-sectional view along the dashed-dotted line A3-A4 in the top view in FIG. 16A.

As illustrated in FIGS. 16A to 16C, the transistor 2000 includes an oxide semiconductor film 2002a and an oxide semiconductor film 2002b that are stacked in this order over an insulating film 2001 formed over a substrate 2007; a conductive film 2003 and a conductive film 2004 that are electrically connected to the oxide semiconductor film 2002b and function as a source electrode and a drain electrode; an oxide semiconductor film 2002c over the oxide semiconductor film 2002b, the conductive film 2003, and the conductive film 2004; an insulating film 2005 that functions as a gate insulating film and is located over the oxide semiconductor film 2002c; and a conductive film 2006 that functions as a gate electrode, lies over the insulating film 2005, and overlaps with the oxide semiconductor films 2002a to 2002c. Note that the substrate 2007 may be a glass substrate, a semiconductor substrate, or the like or may be an element substrate where semiconductor elements are formed over a glass substrate or on a semiconductor substrate.

FIGS. 17A to 17C illustrate another specific example of the structure of the transistor 2000. FIG. 17A is a top view of the transistor 2000. Note that insulating films are not illustrated in FIG. 17A in order to clarify the layout of the transistor 2000. FIG. 17B is a cross-sectional view along the dashed-dotted line A1-A2 in the top view in FIG. 17A. FIG. 17C is a cross-sectional view along the dashed-dotted line A3-A4 in the top view in FIG. 17A.

As illustrated in FIGS. 17A to 17C, the transistor 2000 includes the oxide semiconductor films 2002a to 2002c that are stacked in this order over the insulating film 2001; the conductive films 2003 and 2004 that are electrically connected to the oxide semiconductor film 2002c and function as a source electrode and a drain electrode; the insulating film 2005 that functions as a gate insulating film and is located over the oxide semiconductor film 2002c and the conductive films 2003 and 2004; and a conductive film 2006 that functions as a gate electrode, lies over the insulating film 2005, and overlaps with the oxide semiconductor films 2002a to 2002c.

FIGS. 16A to 16C and FIGS. 17A to 17C each illustrate the structural example of the transistor 2000 in which the oxide semiconductor films 2002a to 2002c are stacked. However, the structure of the oxide semiconductor film included in the transistor 2000 is not limited to a stacked-layer structure including a plurality of oxide semiconductor films and may be a single-layer structure.

In the case where the transistor 2000 includes the semiconductor film in which the semiconductor films 2002a to 2002c are stacked in this order, each of the oxide semiconductor films 2002a and 2002c is an oxide film that contains at least one of metal elements contained in the oxide semiconductor film 2002b and in which energy at the conduction band minimum is closer to the vacuum level than that in the oxide semiconductor film 2002b by higher than or equal to 0.05 eV, 0.07 eV, 0.1 eV, or 0.15 eV and lower than or equal to 2 eV, 1 eV, 0.5 eV, or 0.4 eV. The oxide semiconductor film 2002b preferably contains at least indium because carrier mobility is increased.

When the transistor 2000 includes the semiconductor film with the above structure, when an electric field is applied to the semiconductor film by applying voltage to the gate electrode, a channel region is formed in the oxide semiconductor film 2002b, which has the lowest conduction band energy among the oxide semiconductor films. That is, the oxide semiconductor film 2002c provided between the oxide semiconductor film 2002b and the insulating film 2005 makes it possible to form the channel region in the oxide semiconductor film 2002b, which is separated from the insulating film 2005.

Since the oxide semiconductor film 2002c contains at least one of the metal elements contained in the oxide semiconductor film 2002b, interface scattering is unlikely to occur at the interface between the oxide semiconductor film 2002b and the oxide semiconductor film 2002c. Thus, the movement of carriers is unlikely to be inhibited at the interface, which results in an increase in the field-effect mobility of the transistor 2000.

When an interface state is formed at an interface between the oxide semiconductor films 2002b and 2002a, a channel region is also formed in a region close to the interface; thus, the threshold voltage of the transistor 2000 varies. However, since the oxide semiconductor film 2002a contains at least one of metal elements contained in the oxide semiconductor film 2002b, an interface state is unlikely to be formed at the interface between the oxide semiconductor film 2002b and the oxide semiconductor film 2002a. As a result, such a structure can reduce variations in electrical characteristics (e.g., threshold voltage) of the transistor 2000.

Further, it is preferable that a plurality of oxide semiconductor films be stacked so that an interface level due to an impurity existing between the oxide semiconductor films, which inhibits carrier flow, is not formed at an interface between the oxide semiconductor films. This is because when an impurity exists between the stacked oxide semiconductor films the continuity of the energies of the bottoms of the conduction bands of the oxide semiconductor films is lost, and carriers are trapped or disappear by recombination in the vicinity of the interface. By reducing an impurity existing between the films, a continuous junction (here, in particular, a well structure having a U shape in which energies of the bottoms of the conduction bands are changed continuously between the films) is formed easily as compared with the case of merely stacking the plurality of oxide semiconductor films which contain at least one common metal as a main component.

In order to form such a continuous energy band, it is necessary to form films continuously without being exposed to air, with use of a multi-chamber deposition apparatus (sputtering apparatus) including a load lock chamber. Each chamber of the sputtering apparatus is preferably evacuated to a high vacuum (to $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of $-40°$ C. or lower, preferably $-80°$ C. or lower, further preferably $-100°$ C. or lower and is highly purified, moisture and the like can be prevented from entering the oxide semiconductor film as much as possible. In the case where the oxide semiconductor film 2002b is formed of an In-M-Zn oxide (M is Al, Ti, Ga, Y, Zr, La, Ce, Nd, or Hf) and a target having the atomic ratio of metal elements of In:M:Zn=$x_1$:$y_1$:$z_1$ is used for depositing the oxide semiconductor layer 2002b, $x_1/y_1$ is preferably greater than or equal to 1/3 and less than or equal to 6, further preferably greater than or equal to 1 and less than or equal to 6, and $z_1/y_1$ is preferably greater than or equal to 1/3 and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 2002b is easily formed. Typical examples of the atomic ratio of the metal elements of the target are In:M:Zn=1:1:1 and In:M:Zn=3:1:2. Note that the CAAC-OS will be described in detail later.

In the case where the oxide semiconductor films 2002a and 2002c each contain an In-M-Zn oxide (M is Al, Ti, Ga, Y, Zr, La, Ce, Nd, or Hf) and a target having the atomic ratio of metal elements of In:M:Zn=$x_2$:$y_2$:$z_2$ is used for forming the oxide semiconductor films 2002a and 2002c, $x_2/y_2$ is preferably less than $x_1/y_1$, and $z_2/y_2$ is preferably greater than or equal to 1/3 and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 2002a and 2002c. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 2002a and the oxide semiconductor film 2002c each have a thickness of greater than or equal to 3 nm and less than or equal to 100 nm, preferably greater than or equal to 3 nm and less than or equal to 50 nm. The oxide semiconductor film 2002b has a thickness of greater than or equal to 3 nm and less than or equal to 200 nm, preferably greater than or equal to 3 nm and less than or equal to 100 nm, further preferably greater than or equal to 3 nm and less than or equal to 50 nm.

The three semiconductor films (the oxide semiconductor films 2002a to 2002c) can be either amorphous or crystalline. However, when the oxide semiconductor film 2002b where a channel region is formed is crystalline, the transistor 2000 can have stable electrical characteristics; therefore, the oxide semiconductor film 2002b is preferably crystalline.

Note that a channel formation region refers to a region of the semiconductor film of the transistor 2000, which overlaps with a gate electrode and which is between a source electrode and a drain electrode. Further, a channel region refers to a region through which current mainly flows in the channel formation region.

For example, when an In—Ga—Zn oxide film formed by a sputtering method is used as each of the oxide semiconductor films 2002a and 2002c, the oxide semiconductor films 2002a and 2002c can be deposited with the use of an In—Ga—Zn oxide target containing In, Ga, and Zn with an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

When the oxide semiconductor film 2002b is a CAAC-OS film, the oxide semiconductor film 2002b is preferably deposited with the use of a polycrystalline In—Ga—Zn oxide containing In, Ga, and Zn with an atomic ratio of 1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW. When the oxide semiconductor film 2002b is a CAAC-OS film, the oxide semiconductor film 2002b may be deposited with the use of an In—Ga—Zn oxide target with an atomic ratio of 2:1:3. In the CAAC-OS film deposited with the use of the target, the proportion of a region where a diffraction pattern of the CAAC-OS film is observed in a predetermined area (also referred to as proportion of CAAC) can be high. As a result, the frequency characteristics of a transistor including a channel formation region in the CAAC-OS film can be high.

Note that the oxide semiconductor films 2002a to 2002c can be formed using a sputtering method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off-state current of a transistor having a channel formation region in a highly purified oxide semiconductor. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In that case, it can be seen that off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly-purified oxide semiconductor film was used for a channel formation region of the transistor, and the off-state current of the transistor was measured from a change in the amount of electrical charge of the capacitor per unit hour. As a result, it was found that, in the case where the voltage between the source electrode and the drain electrode of the transistor is 3 V, a lower off-state current of several tens of yA/μm is obtained. Accordingly, the off-state current of the transistor in which the purified oxide semiconductor film is used as a channel formation region is considerably lower than that of a transistor in which silicon having crystallinity is used.

In the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 2000, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contract resistance between the oxide semiconductor film and the source electrode or the drain electrode. Accordingly, the formation of the n-type region increases the mobility and on-state current of the transistor 2000, achieving the high-speed operation of a semiconductor device using the transistor 2000.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material that is easily bonded to oxygen. Examples of such a conductive material include Al, Cr, Cu, Ta, Ti, Mo, and W.

In the case where the semiconductor film including the stacked oxide semiconductor films is used in the transistor 2000, the n-type region preferably extends to the oxide semiconductor film 2002b serving as a channel region in order that the mobility and on-state current of the transistor 2000 can be further increased and the semiconductor device can operate at higher speed.

The insulating film 2001 preferably has a function of supplying part of oxygen to the oxide semiconductor films 2002a to 2002c by heating. It is preferable that the number of defects in the insulating film 2001 be small, and typical spin density at g=2.001 due to a dangling bond of silicon be lower than or equal to $1 \times 10^{18}$ spins/cm$^3$. The spin density is measured by electron spin resonance (ESR) spectroscopy.

The insulating film 2001, which has a function of supplying part of oxygen to the oxide semiconductor films 2002a to 2002c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 2001 can be formed by a plasma CVD method, a sputtering method, or the like.

Note that in this specification, oxynitride contains more oxygen than nitrogen, and nitride oxide contains more nitrogen than oxygen.

Note that in the transistor 2000 illustrated in FIGS. 16A to 16C and FIGS. 17A to 17C, the conductive film 2006 overlaps with end portions of the oxide semiconductor film 2002b including a channel region that do not overlap with the conductive films 2003 and 2004, i.e., end portions of the oxide semiconductor film 2002b that are in a region different from a region where the conductive films 2003 and 2004 are located. When the end portions of the oxide semiconductor film 2002b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 2006 because the end portions of the oxide semiconductor film 2002b that do not overlap with the conductive films 2003 and 2004 overlap with the conductive film 2006 in the transistor 2000 illustrated in FIGS. 16A to 16C and FIGS. 17A to 17C. Consequently, current that flows between the conductive films 2003 and 2004 through the end portions of the oxide semiconductor film 2002b can be controlled by the potential applied to the conductive film 2006. Such a structure of the transistor 2000 is referred to as a surrounded channel (s-channel) structure.

With the s-channel structure, specifically, when a potential at which the transistor 2000 is turned off is supplied to the conductive film 2006, the amount of off-state current that flows between the conductive films 2003 and 2004 through the end portions can be reduced. For this reason, in the transistor 2000, even when the distance between the conductive films 2003 and 2004 at the end portions of the oxide semiconductor film 2002b is reduced as a result of reducing the channel length to obtain high on-state current, the transistor 2000 can have a low off-state current. Consequently, with the short channel length, the transistor 2000 can have a high on-state current when in an on state and a low off-state current when in an off state.

With the s-channel structure, specifically, when a potential at which the transistor 2000 is turned on is supplied to the conductive film 2006, the amount of current that flows between the conductive films 2003 and 2004 through the end portions of the oxide semiconductor film 2002b can be increased. The current contributes to an increase in the field-effect mobility and an increase in the on-state current of the transistor 2000. When the end portions of the oxide semiconductor film 2002b overlap with the conductive film 2006, carriers flow in a wide region of the oxide semiconductor film 2002b without being limited to a region in the vicinity of the interface between the oxide semiconductor film 2002b and the insulating film 2005, which results in an increase in the amount of carrier movement in the transistor 2000. As a result, the on-state current of the transistor 2000 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is the apparent field-effect mobility in a saturation region of the transistor, which is an index of current drive capability.

<Structure of Oxide Semiconductor Film>

A structure of an oxide semiconductor film will be described below. Note that in the following description, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°. Further, the trigonal and rhombohedral crystal systems are included in the hexagonal crystal system in this specification.

An oxide semiconductor film is classified roughly into a single-crystal oxide semiconductor film and a non-single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

<CAAC-OS Film>

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a form reflecting unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is assigned to the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak may also be observed when $2\theta$ is around 36°, in addition to the peak at $2\theta$ of around 31°. The peak at $2\theta$ of around 36° indicates that a crystal having no c-axis alignment is included in part of the CAAC-OS film. It is preferable that in the CAAC-OS film, a peak appear when $2\theta$ is around 31° and that a peak not appear when $2\theta$ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electric characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electric characteristics in some cases.

With the use of the CAAC-OS film in a transistor, variation in the electrical characteristics of the transistor due to irradiation with visible light or ultraviolet light is small.

<Microcrystalline Oxide Semiconductor Film>

Next, a microcrystalline oxide semiconductor film is described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. An oxide semiconductor film including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the diameter of a crystal part. Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots is shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

<Amorphous Oxide Semiconductor Film>

Next, an amorphous oxide semiconductor film is described.

The amorphous oxide semiconductor film is an oxide semiconductor film having disordered atomic arrangement and no crystal part and exemplified by an oxide semiconductor film which exists in an amorphous state as quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and only a halo pattern appears when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is hardly observed in the nc-OS film having good quality.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers including three In—O layers and six Ga—Zn—O layers are layered in the c-axis direction. Accordingly, the spacing between these adjacent layers is substantially equivalent to the lattice spacing (also referred to as d value) on the (009) plane, and is 0.29 nm according to crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

Note that an oxide semiconductor may be a stacked film including two or more films of an amorphous oxide semiconductor film, an a-like OS film, a microcrystalline oxide semiconductor film, and a CAAC-OS film, for example.

This embodiment can be implemented in appropriate combination with any of the other embodiments and the like.

(Embodiment 5)

In this embodiment, an example of a semiconductor device having a structure different from that in FIG. 15 will be described.

Figure 18:
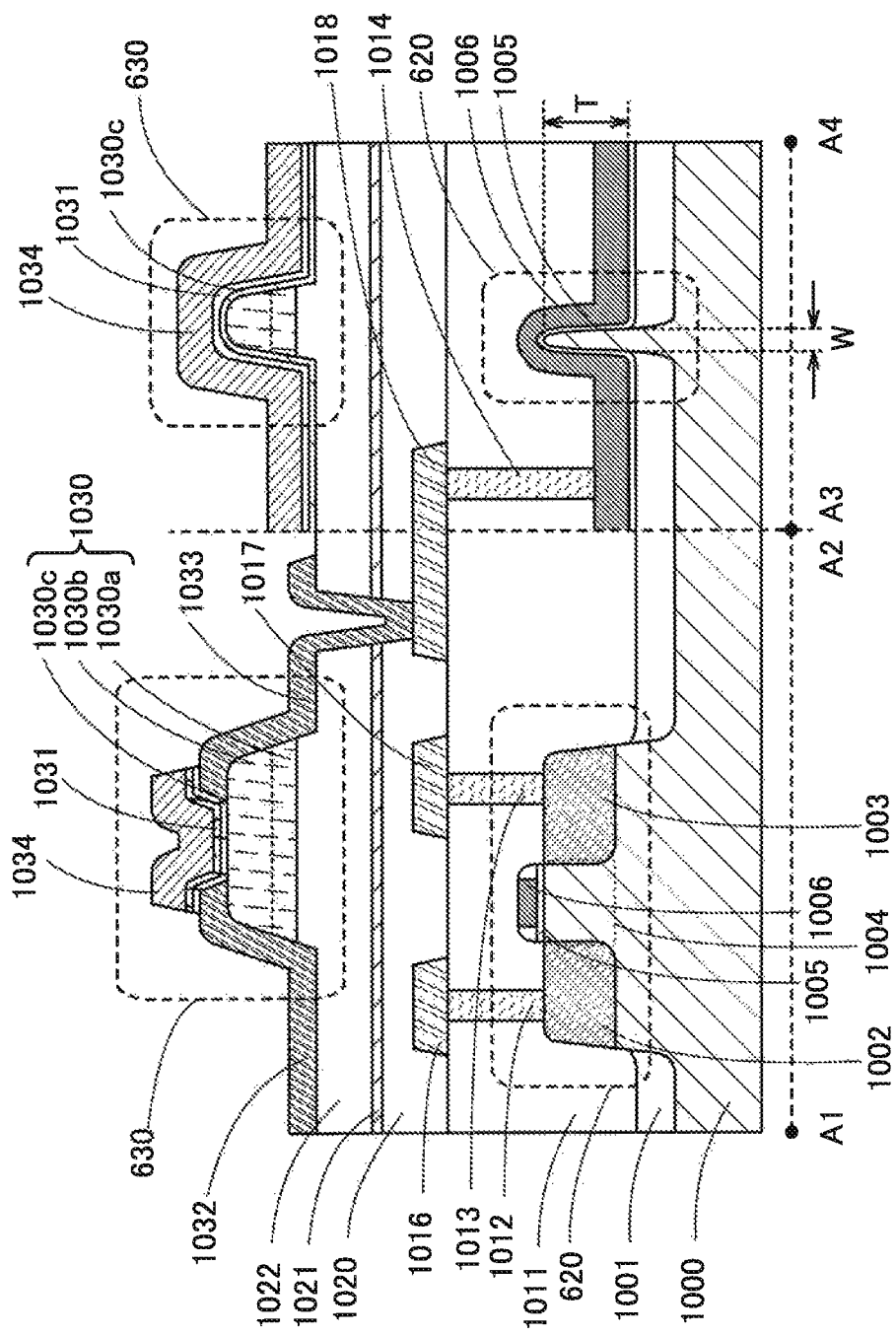
FIG. 18 illustrates an example of a structure of a transistor.

FIG. 18 illustrates an example of a cross-sectional structure of a semiconductor device. In FIG. 18, a region along dashed line A1-A2 shows a structure of the transistors 620 and 630 in the channel length direction, and a region along dashed line A3-A4 shows a structure of the transistors 620 and 630 in the channel width direction. In one embodiment of the present invention, the channel length direction of the transistor 620 is not necessarily aligned with the channel length direction of the transistor 630.

The channel length direction refers to a direction in which a carrier moves between a source (source region or source electrode) and a drain (drain region or drain electrode), and the channel width direction refers to a direction perpendicular to the channel length direction in a plane parallel to a substrate.

FIG. 18 illustrates the case where the transistor 630 that is an OS transistor is formed over the transistor 620 that is a transistor including a material other than an oxide semiconductor in its channel formation region.

Note that such a structure in which the transistor including the material other than an oxide semiconductor in its channel formation region and the OS transistor are stacked can be appropriately used for any of transistors included in the various circuit illustrated in FIGS. 1A to 1C, FIGS. 2A and 2B, FIGS. 3A to 3D, FIG. 5, FIGS. 6A to 6C, FIGS. 7A to 7C, FIG. 8, FIG. 9, FIG. 10, FIGS. 11A and 11B, and FIGS. 12A to 12D.

In this embodiment, as in FIG. 13D, the gate of the transistor 620 is connected to one of the source and the drain of the transistor 630; however, the structure of the present invention is not limited to this. One of the source and the drain of the transistor 620 may be connected to the gate of the transistor 630 (see FIG. 14A), one of the source and the drain of the transistor 620 may be connected to one of the source and the drain of the transistor 630 (see FIG. 14B), or the gate of the transistor 620 may be connected to the gate of the transistor 630 (see FIG. 14C).

The transistor 620 may include the channel formation region in a semiconductor film or a semiconductor substrate of silicon, germanium, or the like in an amorphous, microcrystalline, polycrystalline, or single crystal state. Alternatively, the transistor 620 may include the channel formation region in an oxide semiconductor film or an oxide semiconductor substrate. In the case where channel formation regions of all the transistors are included in an oxide semiconductor film or an oxide semiconductor substrate, the transistor 630 is not necessarily stacked over the transistor 620, and the transistors 630 and 620 may be formed in the same layer.

In the case where the transistor 620 is formed using a thin silicon film, any of the following can be used in the thin film: amorphous silicon formed by a sputtering method or a vapor phase growth method such as a plasma CVD method; polycrystalline silicon obtained by crystallization of amorphous silicon by treatment such as laser irradiation; single crystal silicon obtained by separation of a surface portion of a single crystal silicon wafer by implantation of hydrogen ions or the like into the silicon wafer; and the like.

A substrate 1000 over which the transistor 620 is formed can be, for example, a silicon substrate, a germanium substrate, or a silicon germanium substrate. In FIG. 18, a single crystal silicon substrate is used as the substrate 1000.

The transistor 620 is electrically isolated by element isolation. As the element isolation method, a trench isolation method (a shallow trench isolation (STI) method) or the like is used. FIG. 18 illustrates an example where the trench isolation method is used to electrically isolate the transistor 620. Specifically, in FIG. 18, the transistor 620 is electrically isolated by element isolation using an element isolation region 1001 formed in such a manner that an insulator including silicon oxide or the like is buried in a trench formed in the substrate 1000 by etching or the like and then the insulator is removed partly by etching or the like.

In a projection of the substrate 1000 that exists in a region other than the trench, an impurity region 1002 and an impurity region 1003 of the transistor 620 and a channel formation region 1004 placed between the impurity regions 1002 and 1003 are provided. Furthermore, the transistor 620 includes an insulating film 1005 covering the channel formation region 1004 and a gate electrode 1006 that overlaps with the channel formation region 1004 with the insulating film 1005 provided therebetween.

In the transistor 620, a side portion and an upper portion of the projection in the channel formation region 1004 overlap with the gate electrode 1006 with the insulating film 1005 positioned therebetween, so that carriers flow in a wide area including the side portion and the upper portion of the channel formation region 1004. Therefore, the number of transferred carriers in the transistor 620 can be increased while an area over the substrate occupied by the transistor 620 is reduced. As a result, the on-state current and field-effect mobility of the transistor 620 are increased. Suppose the length in the channel width direction (channel width) of the projection in the channel formation region 1004 is W, and the thickness of the projection in the channel formation region 1004 is T. When the aspect ratio of the thickness T to the channel width W is high, a region where carriers flow becomes larger. Thus, the on-state current of the transistor 620 can be further increased and the field-effect mobility of the transistor 620 can be further increased.

Note that when the transistor 620 is formed using a bulk semiconductor substrate, the aspect ratio is desirably 0.5 or more, further desirably 1 or more.

An insulating film 1011 is provided over the transistor 620. Opening portions are formed in the insulating film 1011. Conductive films 1012 and 1013 that are electrically connected to the impurity regions 1002 and 1003, respectively, and a conductive film 1014 that is electrically connected to the gate electrode 1006 are formed in the opening portions.

The conductive film 1012 is electrically connected to a conductive film 1016 formed over the insulating film 1011. The conductive film 1013 is electrically connected to a conductive film 1017 formed over the insulating film 1011. The conductive film 1014 is electrically connected to a conductive film 1018 formed over the insulating film 1011.

An insulating film 1020 is provided over the conductive films 1016 to 1018. An insulating film 1021 having a blocking effect of preventing diffusion of oxygen, hydrogen, and water is provided over the insulating film 1020. As the insulating film 1021 has higher density and becomes denser or has a fewer dangling bonds and becomes more chemically stable, the insulating film 1021 has a higher blocking effect. The insulating film 1021 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 1021 having an effect of blocking diffusion of hydrogen and water can be formed using, for example, silicon nitride or silicon nitride oxide.

An insulating film 1022 is provided over the insulating film 1021, and the transistor 630 is provided over the insulating film 1022.

The transistor 630 includes, over the insulating film 1022, a semiconductor film 1030 including an oxide semiconductor, conductive films 1032 and 1033 functioning as source and drain electrodes and electrically connected to the semiconductor film 1030, a gate insulating film 1031 covering the semiconductor film 1030, and a gate electrode 1034 overlapping with the semiconductor film 1030 with the gate insulating film 1031 positioned therebetween. Note that an opening is formed in the insulating films 1020 to 1022. The conductive film 1033 is connected to the conductive film 1018 in the opening.

Note that in FIG. 18, the transistor 630 includes at least the gate electrode 1034 on one side of the semiconductor film 1030, and may further include a gate electrode overlapping with the semiconductor film 1030 with the insulating film 1022 positioned therebetween.

In the case where each of the transistor 630 has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 18, the transistor 630 has a single-gate structure where one channel formation region corresponding to one gate electrode 1034 is provided. However, the transistor 630 may have a multi-gate structure where a plurality of channel formation regions are formed in one active layer by providing a plurality of gate electrodes electrically connected to each other.

FIG. 18 illustrates an example in which the semiconductor film 1030 included in the transistor 630 includes oxide semiconductor films 1030a to 1030c that are stacked in this order over the insulating film 1022. Note that in one embodiment of the present invention, the semiconductor film 1030 of the transistor 630 may be formed using a single-layer metal oxide film.

Note that this embodiment can be implemented in appropriate combination with other embodiments.

(Embodiment 6)

The variety of films disclosed in the other embodiments, such as the conductive films, the semiconductor films, and the insulating films can be formed by a sputtering method or a plasma CVD method; however, such films may be formed by another method, e.g., a thermal CVD (chemical vapor deposition) method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, an inert gas (e.g., argon or nitrogen) or the like is introduced when or after a first source gas is introduced so that the source gases are not mixed, and then a second source gas is introduced. Note that in the case where the inert gas is introduced at the same time as the first source gas, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive film, the semiconductor film, and the insulating film which have been disclosed in the embodiments can be formed by a thermal CVD method such as a MOCVD method or an ALD method. For example, in the case where an In—Ga—Zn—O film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (hafnium alkoxide or hafnium amide such as tetrakis(dimethylamide) hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Note that this embodiment can be implemented in appropriate combination with other embodiments.

(Embodiment 7)

In Embodiment 7, application examples of the semiconductor device according to one embodiment of the present invention will be described.

The semiconductor device according to one embodiment of the present invention can acquire predetermined physical quantities or predetermined chemical quantities as shown in the above embodiments. Thus, biological data can be obtained anywhere and anytime when persons, animals, or the like carry the semiconductor device.

As a method for carrying the semiconductor device, in the case of a person for example, attaching a semiconductor device to the surface of the body or implanting it in the body of the person can be considered. However, the method can be appropriately selected in consideration of physical quantities or chemical quantities to be acquired. FIGS. 19A to 19E illustrate specific application examples of the semiconductor device of the present invention.

Figure 19A:
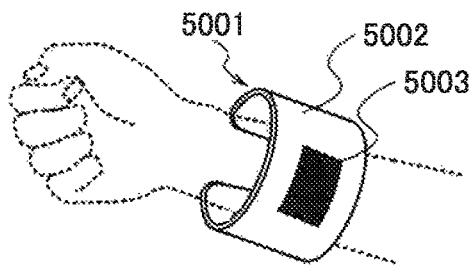
FIGS. 19A to 19E illustrate application examples of a semiconductor device.

FIG. 19A is a bangle-type electronic device 5001, and a semiconductor device 5003 is provided in a housing 5002. The electronic device 5001 is worn by a user so that the semiconductor device 5003 is in contact with the wrist or the arm of the user, whereby biological data can be acquired from the wrist or the arm of the user. Note that the electronic device 5001 can also be worn on the waist or the leg. A belt or the like can be used instead of the housing 5002. The biological data acquired by the semiconductor device 5003 can be read out by a reader/writer, or the like.

Figure 19B:
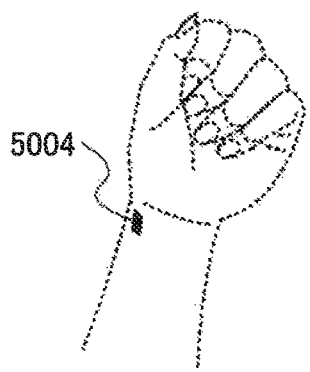
Figure 19C:
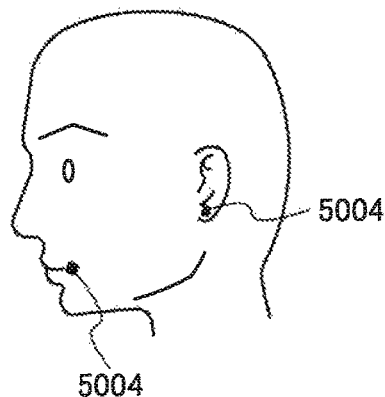

The semiconductor device can also be implanted in the body of the user. FIG. 19B illustrates an application example when the semiconductor device 5004 is implanted in the wrist. In this case, the semiconductor device 5004 can be worn without using a housing or a belt, so that labor for attaching/detaching thereof can be eliminated. Note that the semiconductor device 5004 can be implanted into any portion of the human body such as in the mouth or the earlobe without limitation to the wrist of the user (FIG. 19C).

Figure 19D:
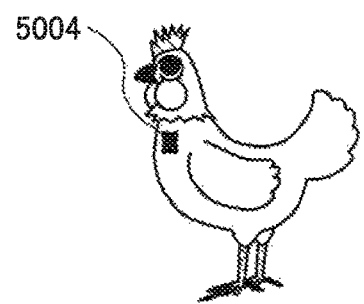

As shown in FIG. 19D, the semiconductor device 5004 can be attached to or implanted into an animal. The biological data of the animal acquired by the semiconductor device 5004 is read out regularly, so that the health condition of the animal can be monitored and managed. In this case, it is possible to manage a plurality of animals simultaneously by making the semiconductor device 5004 store identification numbers in advance.

Figure 19E:
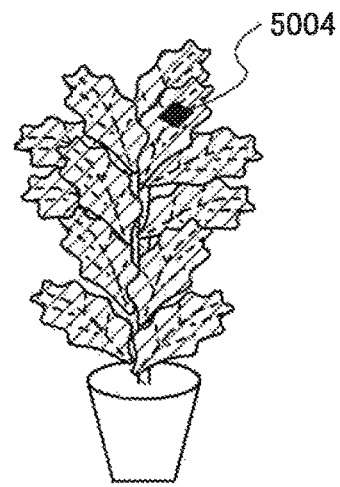

As shown in FIG. 19E, the semiconductor device 5004 can be attached to or implanted into a plant. The biological data of the plant acquired by the semiconductor device 5004 is read out regularly, so that data on flowering time, shipping time, and the like can be expected. When the semiconductor device 5004 includes an element for detecting light, data on sunshine duration can be obtained. When the semiconductor device 5004 includes a solar cell, light from the outside is converted into electric power and the electric power is supplied to the semiconductor device 5004, whereby the semiconductor device 5004 can operate.

As described above, the semiconductor device according to one embodiment of the present invention can be attached to or implanted into the living things such as persons, animals and plants, so that biological data of an individual living things can be easily acquired.

Application examples of this invention are not limited to those described above. The semiconductor device of this invention can be applied to various electronic devices such as display devices, personal computers, image reproducing devices provided with recording media (typically, devices which reproduce the content of recording media such as digital versatile discs (DVDs) and have displays for displaying reproduced images), cellular phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices.

Note that this embodiment can be implemented in appropriate combination with other embodiments.

This application is based on Japanese Patent Application serial no. 2014-105748 filed with Japan Patent Office on May 22, 2014, the entire contents of which are hereby incorporated by reference.

What is claimed is:

1. A semiconductor device comprising:
  a first transistor including an oxide semiconductor in a channel formation region;
  second to fourth transistors;
  a capacitor; and
  first to fifth wirings,
  wherein:
  the first wiring is electrically connected to one of a source and a drain of the first transistor and one of a source and a drain of the second transistor,
  the other of the source and the drain of the first transistor is electrically connected to a gate of the third transistor and one of electrodes of the capacitor,
  a gate of the first transistor is electrically connected to the second wiring,
  the other of the source and the drain of the second transistor is electrically connected to one of a source and a drain of the third transistor and one of a source and a drain of the fourth transistor,
  a gate of the second transistor is electrically connected to the third wiring,
  the other of the source and the drain of the third transistor is electrically connected to the other of electrodes of the capacitor and the fourth wiring, and
  a gate of the fourth transistor is electrically connected to the fifth wiring;
  wherein the second wiring is configured to provide a first voltage and the third wiring is configured to provide a second voltage different from the first voltage.

2. The semiconductor device according to claim 1, wherein the semiconductor device is a first memory circuit.

3. The semiconductor device according to claim 2, wherein the first memory circuit overlaps with at least a part of an arithmetic circuit.

4. The semiconductor device according to claim 1, wherein each of the first wiring and the fourth wiring is electrically connected to a driver circuit which has functions of writing data.

5. The semiconductor device according to claim 4, wherein the second wiring is electrically connected to a driver circuit which has a function of selecting a second memory circuit.

6. The semiconductor device according to claim 1, wherein the second wiring is electrically connected to a driver circuit which has a function of selecting a second memory circuit.

7. The semiconductor device according to claim 1, wherein the other of the source and the drain of the fourth transistor is electrically connected to an arithmetic circuit.

8. A semiconductor device comprising:
  a first memory circuit;
  a second memory circuit, the second memory circuit comprising:
    a first transistor including an oxide semiconductor in a channel formation region;
    second to fourth transistors; and
    a capacitor, and
    first to fifth wirings,
  wherein:
  the first wiring is electrically connected to one of a source and a drain of the first transistor and one of a source and a drain of the second transistor,
  the other of the source and the drain of the first transistor is electrically connected to a gate of the third transistor and one of electrodes of the capacitor,
  a gate of the first transistor is electrically connected to the second wiring,
  the other of the source and the drain of the second transistor is electrically connected to one of a source and a drain of the third transistor and one of a source and a drain of the fourth transistor,
  a gate of the second transistor is electrically connected to the third wiring,
  the other of the source and the drain of the third transistor is electrically connected to the other of electrodes of the capacitor and the fourth wiring,
  a gate of the fourth transistor is electrically connected to the fifth wiring,
  the first memory circuit is configured to store data acquired from an outside, and
  the second memory circuit is configured to store reference data;
  wherein the second wiring is configured to provide a first voltage and the third wiring is configured to provide a second voltage different from the first voltage.

9. The semiconductor device according to claim 8, wherein each of the first wiring and the fourth wiring is electrically connected to a driver circuit which has functions of writing data.

10. The semiconductor device according to claim 9, wherein the second wiring is electrically connected to a driver circuit which has a function of selecting the first memory circuit.

11. The semiconductor device according to claim 8, wherein the second wiring is electrically connected to a driver circuit which has a function of selecting the first memory circuit.

12. The semiconductor device according to claim 8, wherein the other of the source and the drain of the fourth transistor is electrically connected to an arithmetic circuit.

13. The semiconductor device according to claim 8, wherein the second memory circuit overlaps with at least a part of an arithmetic circuit.

14. The semiconductor device according to claim 8 further comprising an arithmetic circuit, wherein the arithmetic circuit is configured to compare the data and the reference data.

* * * * *